United States Patent [19]

Shiraishi et al.

[11] Patent Number: 5,339,539
[45] Date of Patent: Aug. 23, 1994

[54] SPINDRIER

[75] Inventors: Hirofumi Shiraishi, Kurume; Yoshiyuki Honda, Kumamoto, both of Japan

[73] Assignees: Tokyo Electron Limited, Tokyo; Tokyo Electron Saga Limited, Tosu, both of Japan

[21] Appl. No.: 46,986

[22] Filed: Apr. 16, 1993

[30] Foreign Application Priority Data

| Apr. 16, 1992 | [JP] | Japan | 4-122718 |
| Apr. 16, 1992 | [JP] | Japan | 4-122719 |
| Sep. 22, 1992 | [JP] | Japan | 4-277811 |
| Mar. 4, 1993 | [JP] | Japan | 5-44027 |
| Mar. 4, 1993 | [JP] | Japan | 5-44028 |

[51] Int. Cl.$^5$ ............................................. F26B 17/24
[52] U.S. Cl. ....................................... 34/58; 34/242; 34/184
[58] Field of Search .................. 34/242, 58, 8, 133, 34/184; 432/242

[56] References Cited

U.S. PATENT DOCUMENTS 4,571,850 2/1986 Hunt et al. ........................ 34/242

FOREIGN PATENT DOCUMENTS 58-9325 1/1983 Japan .
1-255227 10/1989 Japan .

*Primary Examiner*—Henry A. Bennet
*Attorney, Agent, or Firm*—Oblon, Spivak, McClelland, Maier & Neustadt

[57] ABSTRACT

A spindrier according to the present invention includes a box body enclosing a plurality of wafers, a rotor for holding the wafers in the box body and rotated by a motor, and upper and lower clamp bars for holding the wafers face to face with their faces directed perpendicular to rotating shafts of the rotor. The lower clamp bars are connected and fixed to the rotating shafts so as to hold lower rim portions of the wafers thereon when the wafers are set in the rotor. The upper clamp bars are connected to one of the rotating shafts at their base ends so that they can be swung vertically erect and also and horizontally relative to the rotating shaft and they are locked to the other rotating shaft at their front ends when they are swung horizontally. They include a mechanism for swinging them, a locking mechanism for locking their front ends to the other rotating shaft, and an unlocking mechanism for releasing their front ends from the other rotating shaft.

16 Claims, 23 Drawing Sheets

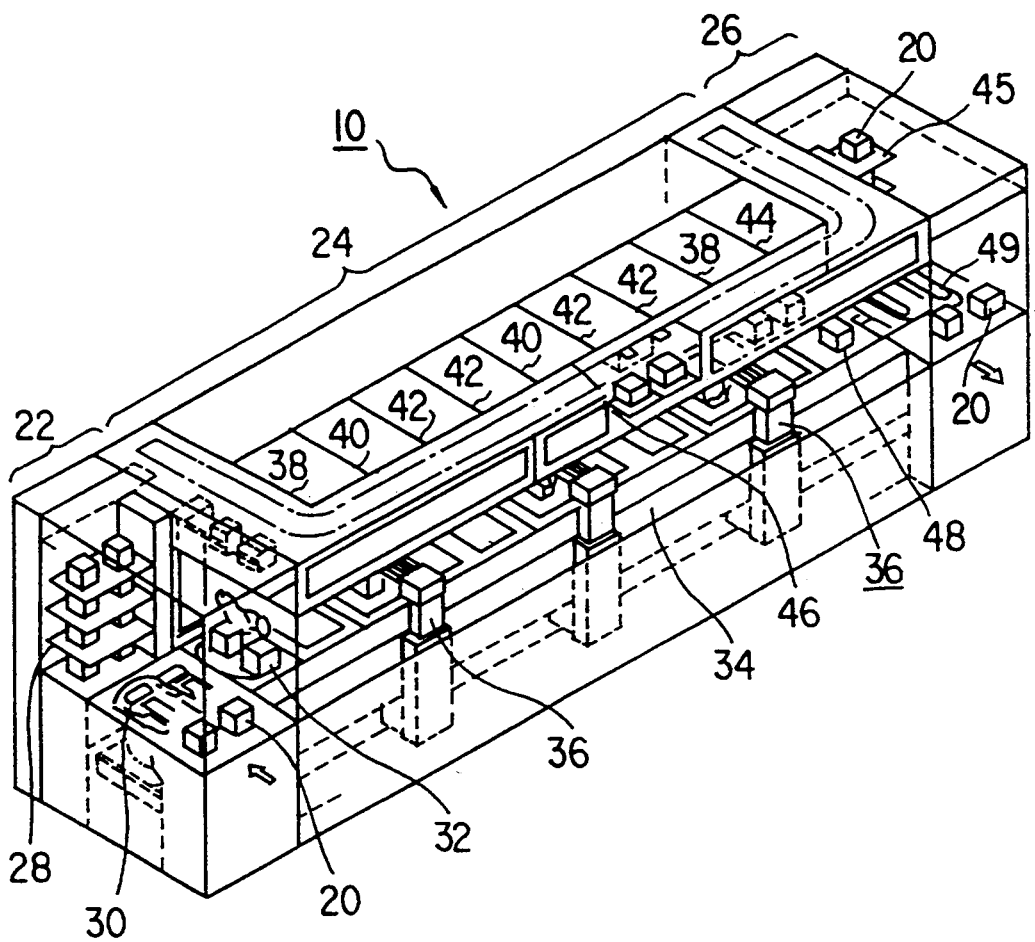
F I G. 1

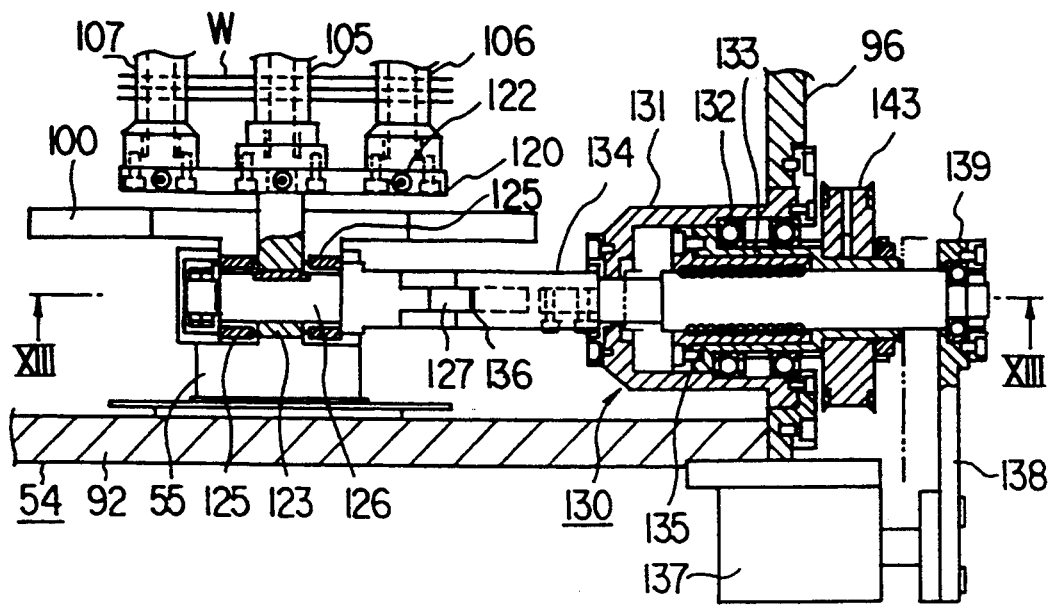
F I G. 12
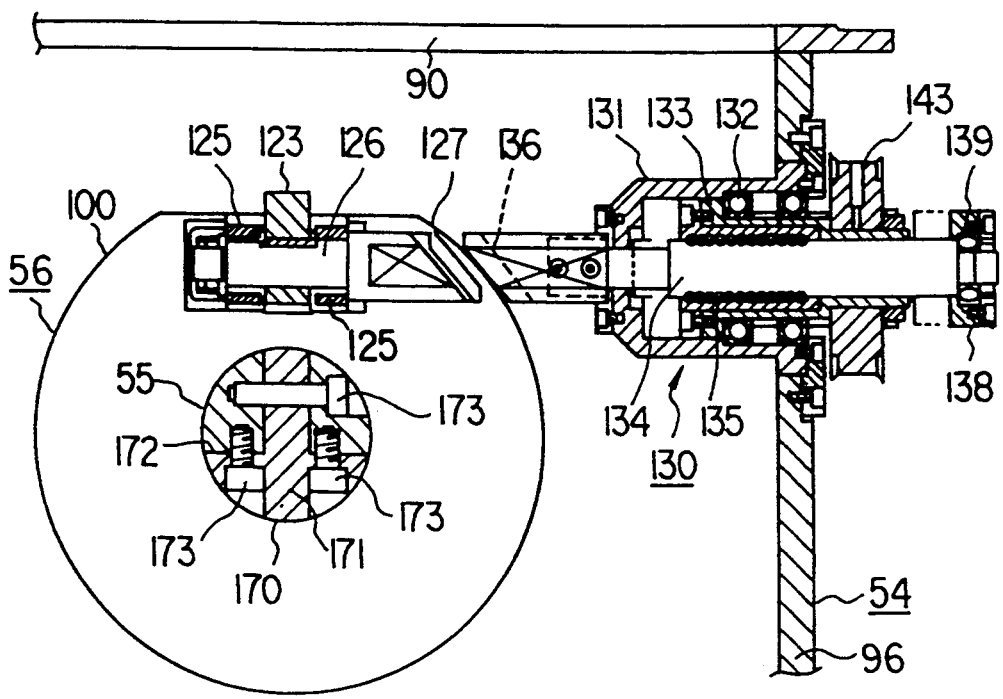
F I G. 13

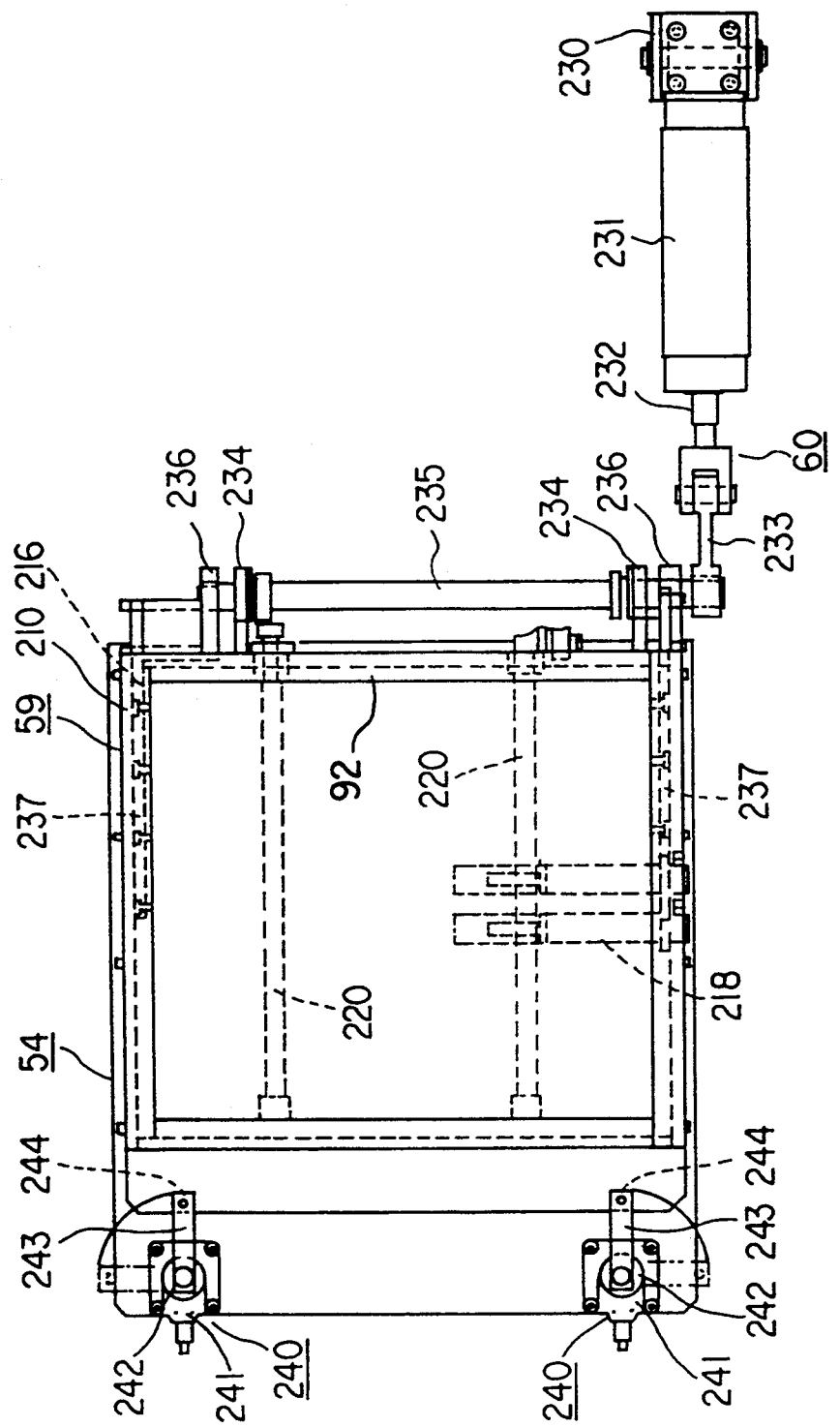
F I G. 21

5,339,539

SPINDRIER

BACKGROUND OF THE INVENTION

Field of the Invention

The present invention relates to a spindrier for removing solution or solution drops from substrates such as semiconductor wafers and drying them.

Description of the Related Art

Semiconductor devices such as super LSLs have been more and more highly integrated and their circuit patterns have been micro-structured to the order of submicrons. In addition, the diameter of semiconductor wafers has been made larger and larger to 8 inches and upto 12 inches. When quite a few particles which could be neglected in the conventional cases should adhere to the semiconductor wafers, therefore, the productivity of the wafers is reduced to a greater extent. In order to solve this, the semiconductor wafers are immersed in acid and alkali solutions in cleaning vessels of the automatic cleaning system. The surface of each wafer is thus made clean.

In the case of this automatic cleaning system, the wafers are cleaned with chemical solutions, water-washed and dried. The spindrier is used in the drying chamber of the automatic cleaning system to increase the productivity of wafers. Such spindrier is disclosed in a Japanese Patent Disclosure Hei 1-255227.

In the case of this conventional spindrier, however, the force with which the upper clamp bars hold the wafers is poor. The rotor is thus deformed and shaken (or it is not rotated round its rotating shaft) when it is being rotated at high speed. High noises are caused accordingly. In addition, the wafers are vibrated in their corresponding grooves on the clamp bars during the rotation of the rotor. The rim portions of the wafers are thus damaged.

Still further, solutions or solution drops enter into a clearance between rotating shafts and support members to thereby make it impossible to keep the rotor rotating smoothly for a long period of time.

SUMMARY OF THE INVENTION

An object of the present invention is therefore to provide a spindrier capable of keeping the rotor from being deformed, even when a large load is added, to more reliably hold wafers in the rotor.

Another object of the present invention is to provide a spindrier for enabling the rotor and the rotation drive shafts to be more easily maintained and checked so as to have a longer life.

According to an aspect of the present invention, there can be provided a spindrier comprising a box body enclosing the substrates; a pair of rotating shaft members opposed to each other and extending into the box body through both sides thereof; rotor means supported by the paired rotating shaft members; and means for rotating at least one of said rotating shaft members; wherein said rotor means has a plurality of upper and lower clamp members for clamping and holding the substrates face to face with their faces directed perpendicular to the rotating shaft members, wherein said lower clamp members are connected and fixed to the rotating shaft members to hold lower portions of the substrates thereon when the substrates are set in the rotor means, and said upper clamp members have base ends connected to one of said rotating shaft members so that they can be swung erected and horizontal relative to the rotating shaft member, front ends locked to the other rotating shaft member when they are swung horizontal, means for swinging them, a locking mechanism for locking their front ends to the other rotating shaft member, and an unlocking mechanism for unlocking their front ends from the other rotating shaft member.

According to another aspect of the present invention, there can be provided a spindrier comprising a box body enclosing the substrates; a pair of rotating shaft members opposed to each other and extending into the box body through both sides thereof; rotor means supported by the paired rotating shaft members; and means for rotating at least one of the rotating shaft members; wherein said rotor means has a plurality of upper and lower clamp members for clamping and holding the substrates face to face with their faces directed perpendicular to the rotating shaft members, wherein said lower clamp members are connected and fixed to the rotating shaft members to hold lower portions of said substrates thereon when the substrates are set in the rotor means, a switching arm for pushing and releasing them to and from the substrates, a hollow shaft connected to the rotating shaft member to make it rotatable, and a center shaft passed through the hollow rotating shaft and connected to the switching arm to swing it.

According to a further aspect of the present invention, there can be provided a spindrier comprising a box body enclosing the substrates; a pair of rotating shaft members opposed to each other and extending into the box body through both sides thereof; rotor means supported by the pair of rotating shaft members; means for rotating at least one of the rotating shaft members; bearing housings attached to both sides of said box body; a bearing arranged in each bearing housing to support the rotating shaft member freely rotatable; a magnetic liquid seal member arranged in each bearing housing to seal a clearance formed round the rotating shaft member; a labyrinth seal located nearer to the box body than the magnetic liquid seal member is; means for supplying clean air or gas into a narrow space formed by the labyrinth seal; and a plurality of slingers located nearer to the box body than the labyrinth seal is and rotated together with the rotating shaft member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view schematically showing the whole of the cleaning system;

FIG. 12 is a vertically-sectioned view showing the upper holder members switching mechanism;

FIG. 13 is a sectional view taken along a line XIII—XIII in FIG. 12 and showing the upper holder members (or clamp bars) switching mechanism;

FIG. 21 is a plan showing the switching and clamping mechanisms for the gas cleaner;

DESCRIPTION OF THE PREFERRED EMBODIMENTS

Figure 2:
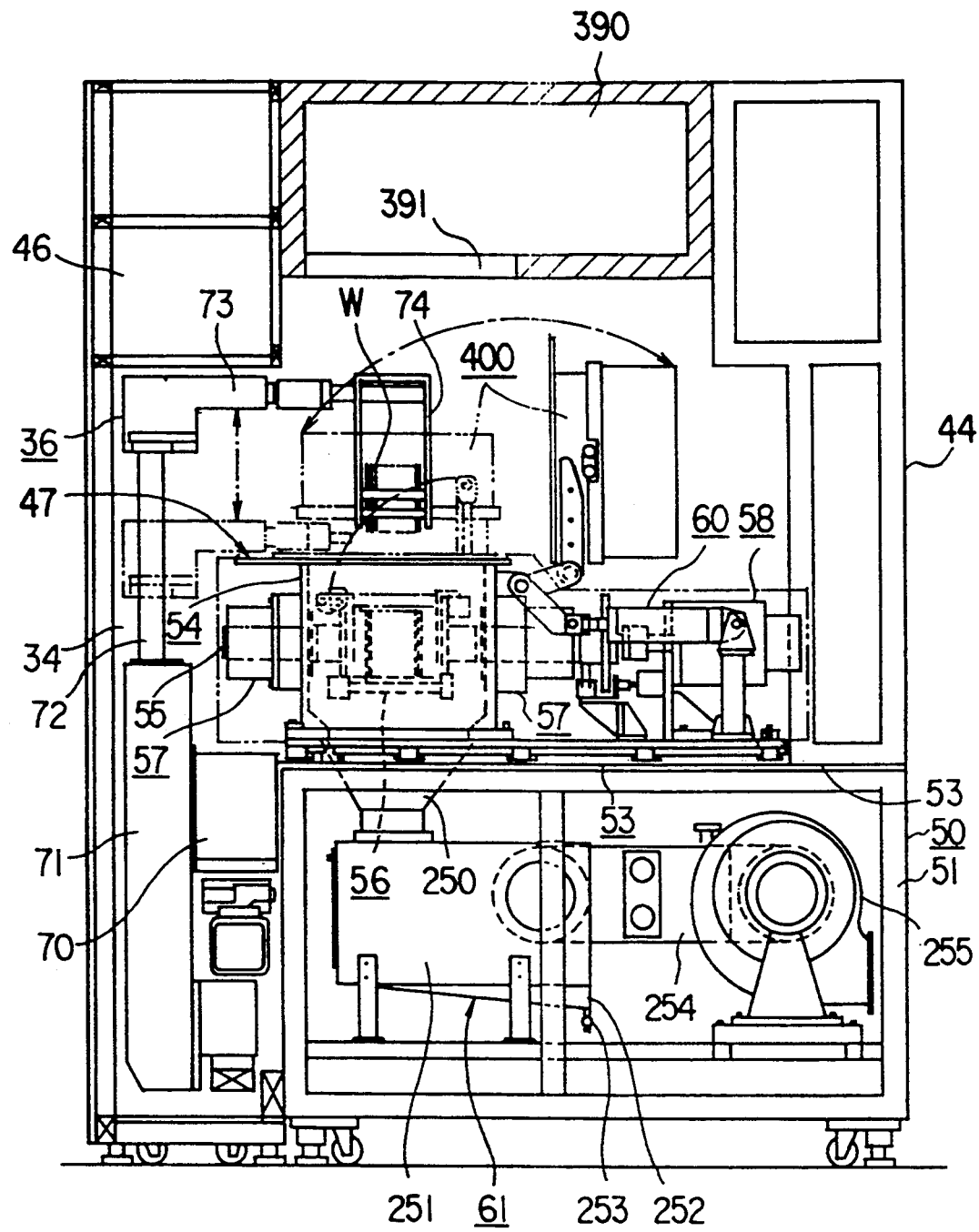
FIG. 2 is a partially sectional view showing the inside of a drying chamber in which the spindrier is provided.

Some spindriers according to the present invention used to clean and dry semiconductor wafers will be described with reference to the accompanying drawings.

As shown in FIG. 1, a cleaning system 10 includes three sections comprising cleaning, input and output buffer sections 24, 22 and 26. The input buffer section 22 is located on the side of an loader unit 32 in the cleaning section 24. The output buffer section 26 is located on the side of an unloader unit 48 in the cleaning section 24. The cleaning section 24 includes a lower area for cleaning semiconductor wafers W and an upper area for cleaning cassettes 20.

Two cassettes 20 are received by the input buffer section 22. Each cassette 20 houses twenty five sheets of 8-inch silicon wafers W therein. Two cassettes carrying units 30 are mounted on a turn-table. A cassettes stocking unit 28 is located on the rear side of the input buffer section 22.

The cleaning section 24 includes nine process divisions. These process divisions 38–44 are arranged side by side on a line to enable the wafers W to be sequentially cleaned in each of them. Two of these process divisions 38 are intended to clean and dry wafer chucks, two other divisions 40 are to wash the wafers with chemical solutions, four other divisions 42 are to wash the wafers with water and final one division 44 is to dry the wafers. Three wafers carrying units 36 are arranged along these process divisions 38–44.

As shown in FIG. 2, each wafers carrying unit 36 is mounted on a truck 70 and can run through a passage 34. A lifter 71 of each wafers carrying unit 36 is attached to one side of the truck 70 and it includes a servomotor and a ball screw. Each wafers carrying unit 36 includes a piston rod 72, an arm 73 and a wafer chuck 74, by which up to fifty two sheets of wafers, as a maximum, can be held together. In other words, a pair of holder rods 75 are attached, above and below, to the lower end portion of the chuck 74 and the wafers W are held in grooves on these holder rods 75.

A swing window (not shown) made by a transparent acryl plate is attached to the front of the cleaning section 24 to enable the process divisions 38–44 to be viewed from outside. A plurality tanks (not shown) in which chemical solutions, pure water and others are contained are arranged on the rear side of the cleaning section 24. A cassette liner 46 is arranged above and parallel to the wafers carrying passage 34.

As shown in FIG. 2, a spindrier 47 is arranged in the wafers drying division 44. The rotating part of the spindrier 47 is mounted on a pedestal 50 and a rotation holder mechanism (or rotor) 56 is housed in a box body (or housing) 54. The housing 54 is arranged on a top 52 of a pedestal frame 51 via an attaching base mechanism 53. The rotor 56 is connected to shafts 55 of a motor 58. The shafts 55 are supported by cases 175 and 176. A clean gas introducing mechanism 400 is capped to the open top of the box body 54. It is connected to the box body 54 by hinge couplings 402 and 404 which have a cylinder 60. It serves to supply clean gas into the box body 54 and also serves as a cap to close an open top 399 of the box body 54. The bottom of the box body 54 is communicated with a gas and solution discharging mechanism 61.

The rotor 56 for the spindrier 47 will be described referring to FIGS. 3, 4 and 7–11.

The rotor 56 is intended to hold fifty two sheets of wafers W vertical at a certain pitch interval. A pair of flywheels 100 and 101 are coaxially and opposedly connected to and supported by the shafts 55. The shafts 55 are passed through both sides 92 of the box body 54 and connected to the rotor 56 in the box body 54 through a detachable assembly of parts 170, 171, 172 and 173.

Three lower holder members (or clamp bars) 102, 103 and 104 are arranged between the flywheels 100 and 101 to bridge them at their lower portions. Three upper holder members (or clamp bars) 105, 106 and 107 are also arranged between the flywheels 100 and 101 to bridge them at their upper portions.

The rotor 56 will be described in greater detail referring to FIGS. 7–9 and 12–19.

Figure 7:
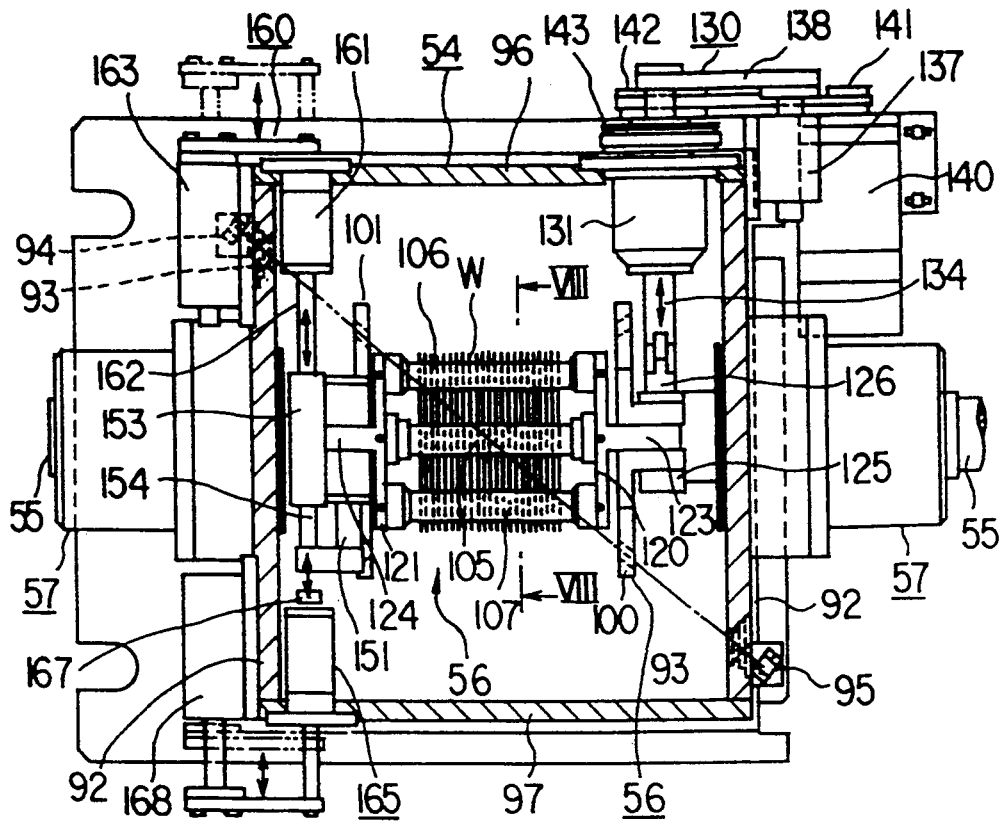
FIG. 7 is a sectional and perspective view showing rotation holder and bearing mechanisms and upper holder members (or clamp bars) switching and unlocking mechanisms.
Figure 8:
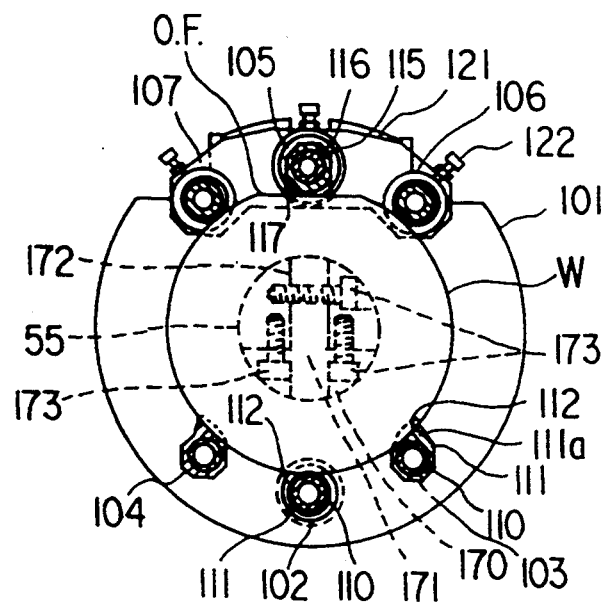
FIG. 8 is a sectional view taken along a line VIII—VIII in FIG. 7 and showing the rotation holder assembly.

As shown in FIGS. 7 and 8, both ends (base and front) of each of the three upper clamp bars 105, 106 and 107 are fixed and connected to arc-like flywheels 120 and 121 by position adjusting bolts 122. These flywheels 120 and 121 are made of stainless steel. The flywheel 120 is located on the side of the motor 58. Protrusions 123 and 124 are projected outward from center rear sides of the flywheels 120 and 121 and they are shaped substantially like a letter of T when viewed flat. Each of them is a thick member having bolt holes.

The protrusion 123 is fitted into a shaft 126 through a rotation stopping wedge. The shaft 126 is rotatably supported by a bearing assembly 125. The bearing assembly 125 is of the two-divided type and made of PEEK. It is fixed to the upper rear side of the flywheel 100. The protrusion 123 is between the two-divided parts of the bearing assembly 125. When the shaft 126 is rotated by a mechanism 130, the upper clamp bars 105, 106 and 107 are swung together with the shaft 126 by about 90 degrees, changing their posture from erected (or vertical) to a lowered (or horizontal) state.

The mechanism 130 is shown in FIGS. 7, 12 and 13. It includes a bearing housing 131, a rotating shaft sleeve 133 and a transmission shaft 134. The bearing housing 131 is sealingly attached to that side 96 of the box body 54 which is perpendicular to the shaft 126. The rotating shaft sleeve 133 is rotatably supported by a bearing 132. The transmission shaft 134 is passed through the rotating shaft sleeve 133.

As shown in FIG. 13, the shaft 134 of the mechanism 130 is usually retreated not so as a not to interfere with the rotor 56, but it is advanced forward from the side 96 of the box body 54 to engage the shaft 126 when the upper clamp bars 105, 106 and 107 are to be erected vertically and lowered so as to be horizontal. One end of the shaft 126 is obliquely cut and an engaging projection (or tenon) 127 is formed on this obliquely-cut face. The transmission shaft 134 and the rotating shaft sleeve 133 are locked together by a mechanical lock 135 to rotate as a unit.

A plurality of guide grooves are formed on the inner face of the rotating shaft sleeve (or guide cylinder) 133 and the mechanical lock 135 is fitted into these guide grooves to reciprocate the shaft 134 in the thrust direction. The front end of the transmission shaft 134 is obliquely cut and an engaged recess (or mortise) 136 is formed on this obliquely-cut face. When the transmission shaft 134 is advanced forward, its engaged recess 136 is engaged with the engaging projection 127 of the shaft 126. When it is retracted, it is released from the shaft 126.

Figure 14:
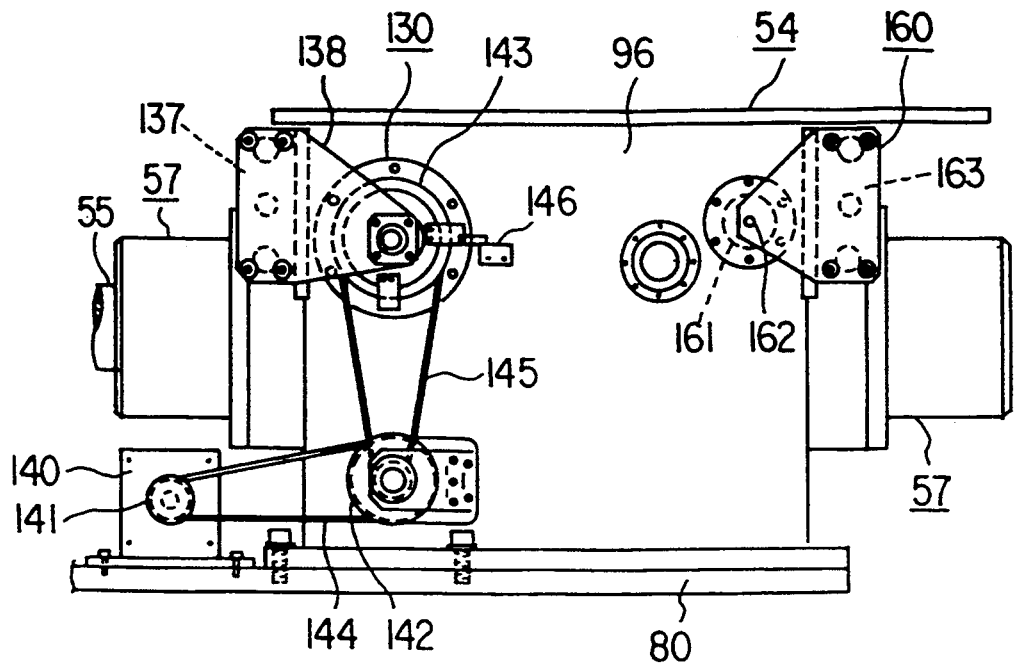
FIG. 14 shows a drive section of the upper holder members switching mechanism viewed from one side of a box body.
Figure 15:
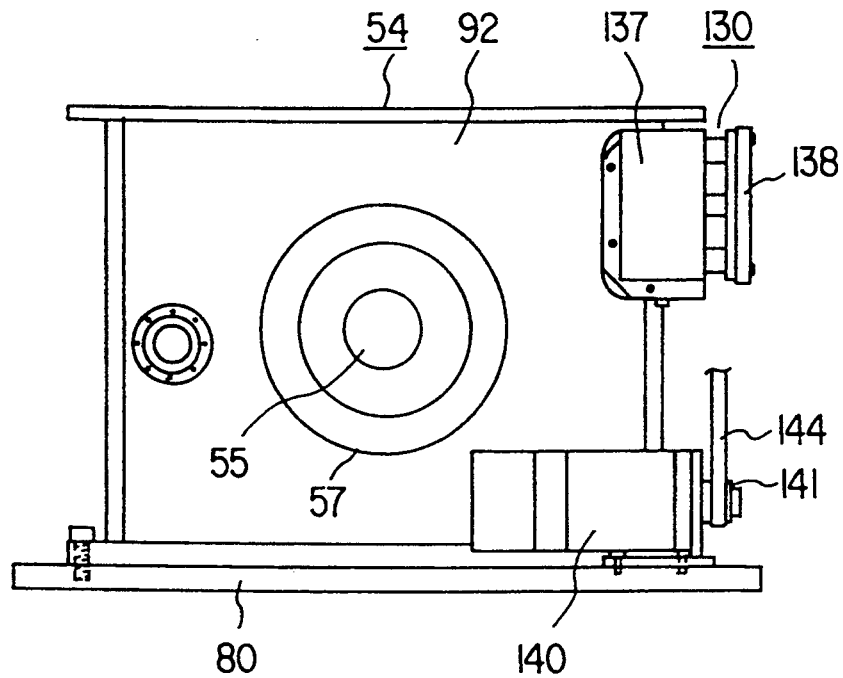
FIG. 15 shows the drive section of the upper holder members switching mechanism viewed from the side of one end face of the box body.

As shown in FIGS. 14 and 15, an air cylinder 137 for reciprocating the transmission shaft 134 is located outside the side 92 of the box body 54 and the front end of its piston rod is connected to one end of connecting arm 138. The other end of this arm 138 is connected to the outer end of the transmission shaft 134 through a thrust ball bearing 139. A motor 140 for the transmission shaft 134 is attached to an upper base plate 80. A belt 144 is stretched between drive pulley 141 and a reduction pulley 142. A belt 145 is also stretched between the reduction pulley 142 and a transmission pulley 143. The rotating shaft sleeve 133 is rotated together with the transmission shaft 134 by the motor 140 to transmit rotation force to the shaft 126. The angle to which they are rotated is detected by a sensor 146 and the motor 140 is controlled responsive to angles thus detected.

Figure 9:
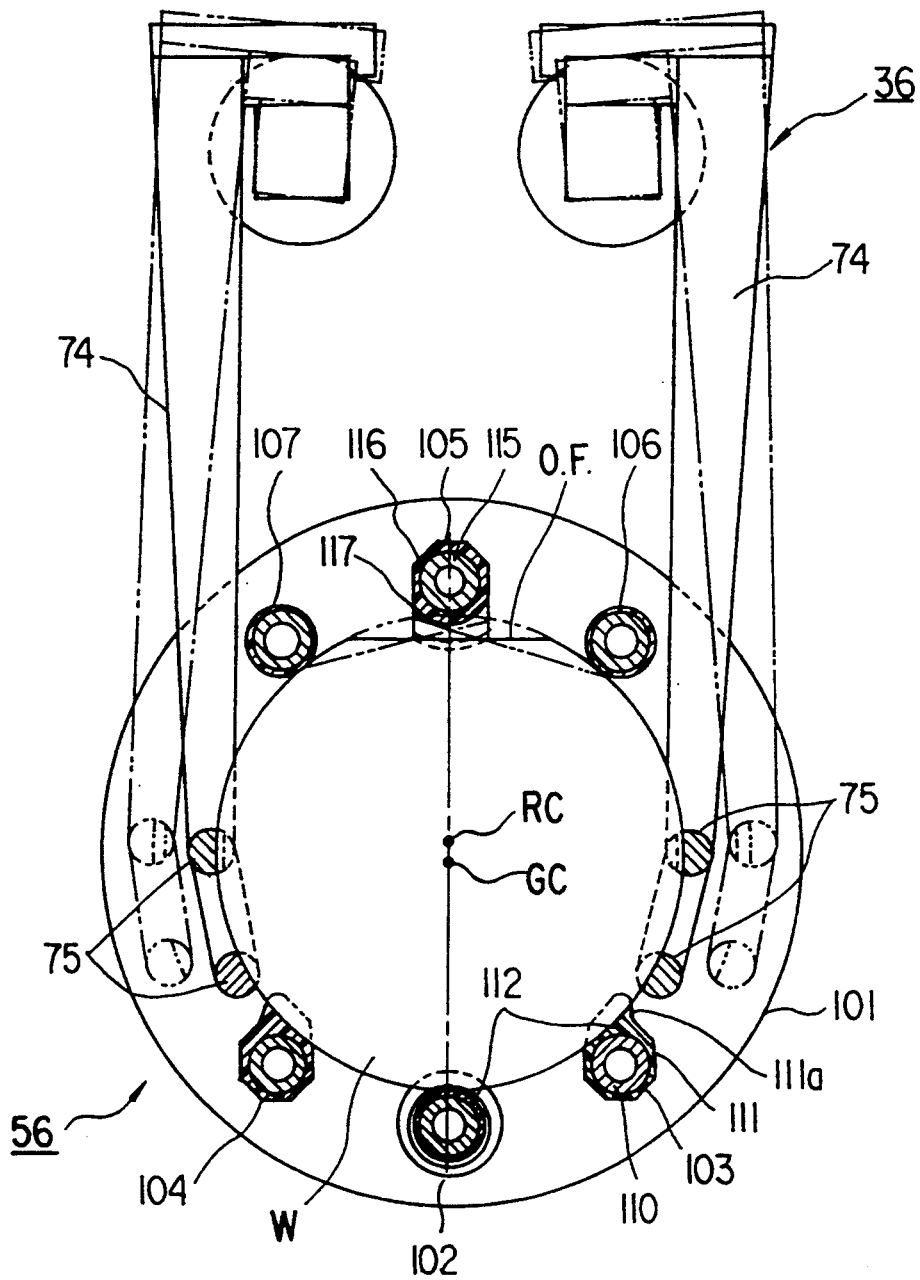
FIG. 9 is a sectional view intended to explain how are for wafers positioned relative to the rotation holder assembly and wafers carrying arms.

As shown in FIGS. 8 and 9, the wafers W are rotated together with the upper and lower clamp bars 102–107 and the flywheels 100, 101 at high speed. Each of the lower clamp bars 102, 103 and 104 is a double pipe made by cladding a round stainless-steel-made pipe 110 with a polyfluoroethylene resin made pipe 111. A plurality of fifty two grooves 112 (or 113) are formed round the pipe 111 at a certain pitch interval and the wafers W are seated in these grooves.

Figure 10:
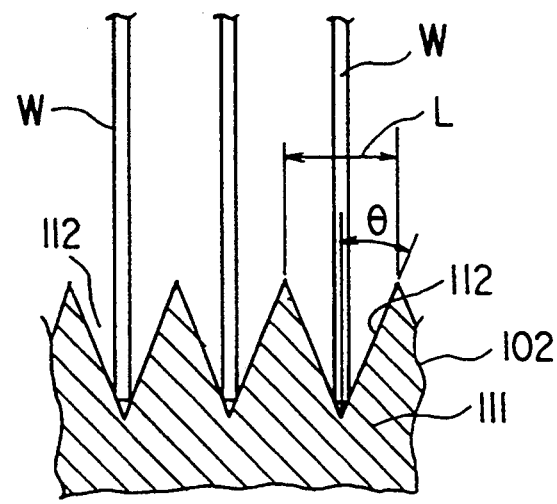
FIG. 10 is a sectional view showing a part of the wafer clamp enlarged, said wafer clamp having a plurality of V-shaped grooves formed on the part thereof.

As shown in FIG. 10, each of the grooves 112 is shaped like the letter V when vertically sectioned. The width L between tops of each groove 112 is in a range of 3–7 mm and the angle $\theta$ of a tilted side of each groove 112 relative to a line vertically extending through the center of each groove is about 20 degrees. It is preferable that the angle $\theta$ is set in a range of 15–45 degrees. Each wafer W is about 0.5–0.8 mm thick. When the wafers W are seated in their corresponding grooves 112, therefore, pure water and other cleaning solutions will not remain in any of clearances each being formed between one side of each wafer and one tilted side of each groove.

Figure 11:
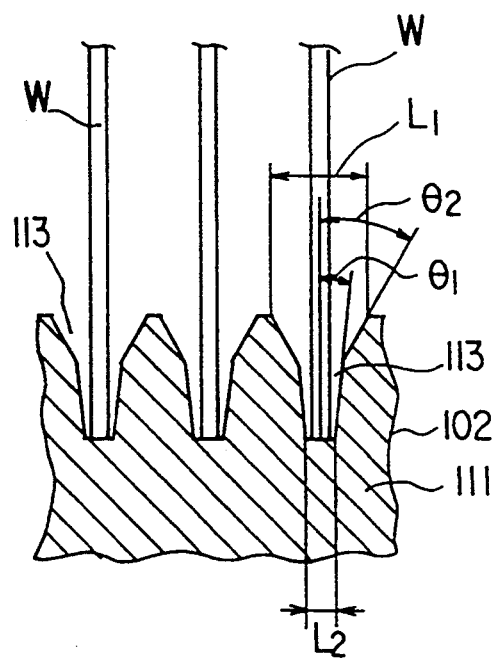
FIG. 11 is a sectional view showing a part of the wafer clamp enlarged, said wafer clamp having a plurality of Y-shaped grooves formed on the part thereof.

As shown in FIG. 11, Y-shaped grooves may be formed round the pipe 111. The width $L_1$ between tops of each groove 113 is in a range of 3–7 mm and the width $L_2$ of the bottom of each groove 113 is about 0.89 mm. The angle $\theta_1$ of the lower tilted side of each groove 113 relative to the line extending through the center of each groove is in a range of 5°–8°. It is preferable that the angle $\theta_1$ is set in a range of 4°–12°. The angle $\theta_2$ of the upper tilted side of each groove 113 relative to the line is about 20°. It is preferable that the angle $\theta_2$ is set in a range of 20°–45°. When the wafers are seated in their corresponding grooves 113, their circumferential faces are contacted with the bottoms of grooves 113.

As shown in FIGS. 8 and 9, the outer pipe (or polyfluoroethylene resin made pipe) 111 of the lower center support member 102 is shaped cylindrical and the grooves 112 are formed round the pipe 111. The outer pipe 111 of each of the lower side support members 103 and 104 has a deformed cylindrical section provided with a projection 111a, and the grooves 112 are formed only on the top slope of this projection 111a. The bottom of each of the grooves 112 on the lower side support members 103 and 104 is swelled in an inverted R. This is intended to prevent each wafer from falling sidewards in the groove 112.

The three upper clamp bars 105, 106 and 107 serve to firmly hold the wafers W and to enable the whole of the rotor 56 to be rotated under good balance. The wafers W are positioned in such a way that their orientation flats (which will be hereinafter referred to as O.F.) are directed toward the upper clamp bars 105, 106 and 107.

Each of the three upper support members 105, 106 and 107 is of the double pipe type same as the above-described lower support member 102. A plurality of grooves 117 are formed round a fluorine-resin-made pipe 116 of each of them. These grooves 117 are of substantially the same shape as but a little wider than the grooves 112 of the lower clamp bar 102.

As shown in FIG. 9, the gravity center GC of the wafers W is slightly shifted from the center of rotation RC of the rotor 56 when the wafers are clamp-held. In short, the rotation axis center RC is not in accordance with the center of gravity GC but is slightly shifted toward the O.F. of the wafer. When arranged in this manner, the wafers are pushed toward the lower support members 102, 103, 104 by centrifugal force and thus prevented from rolling with respect to the rotor 56 during rotation of the rotor 56. When the wafers W are being spun, therefore, their edges cannot be damaged and noise can be reduced to a greater extent.

Figure 3:
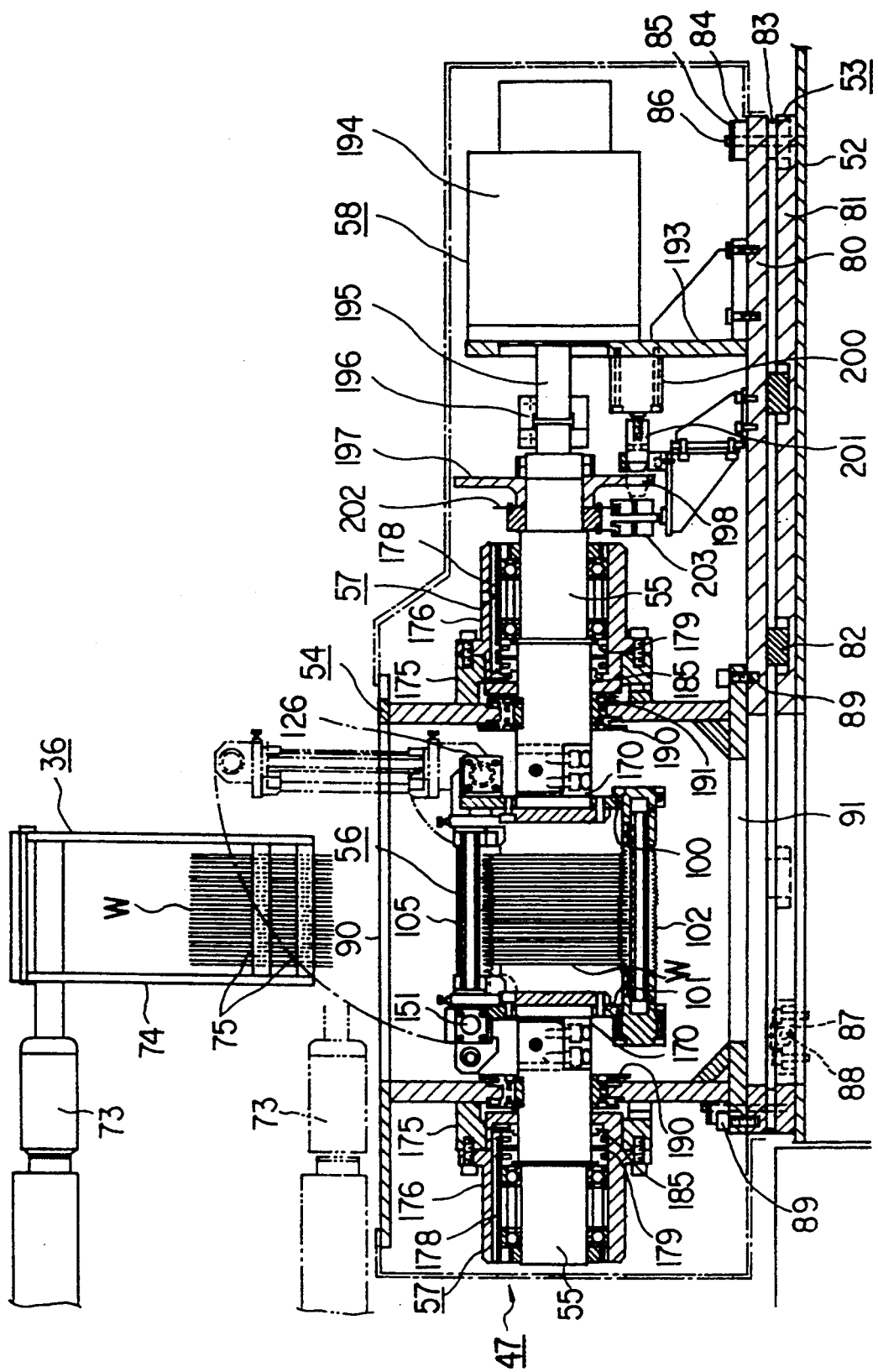
FIG. 3 is a vertically-sectioned view showing the drying chamber in which the spindrier according to an embodiment of the present invention is provided.
Figure 4:
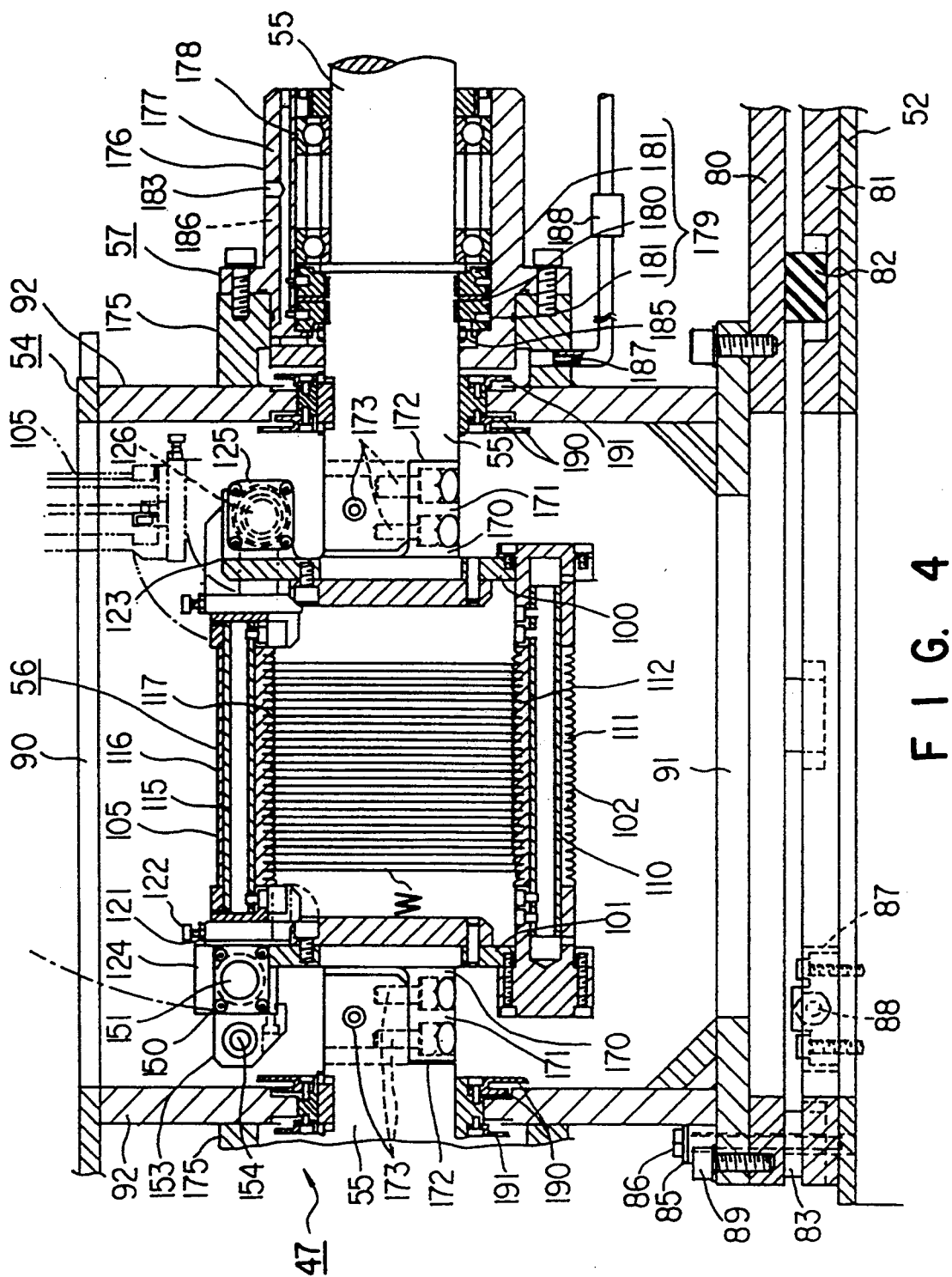
FIG. 4 is a vertically-sectioned view showing a rotary section of the spindrier.
Figure 18:
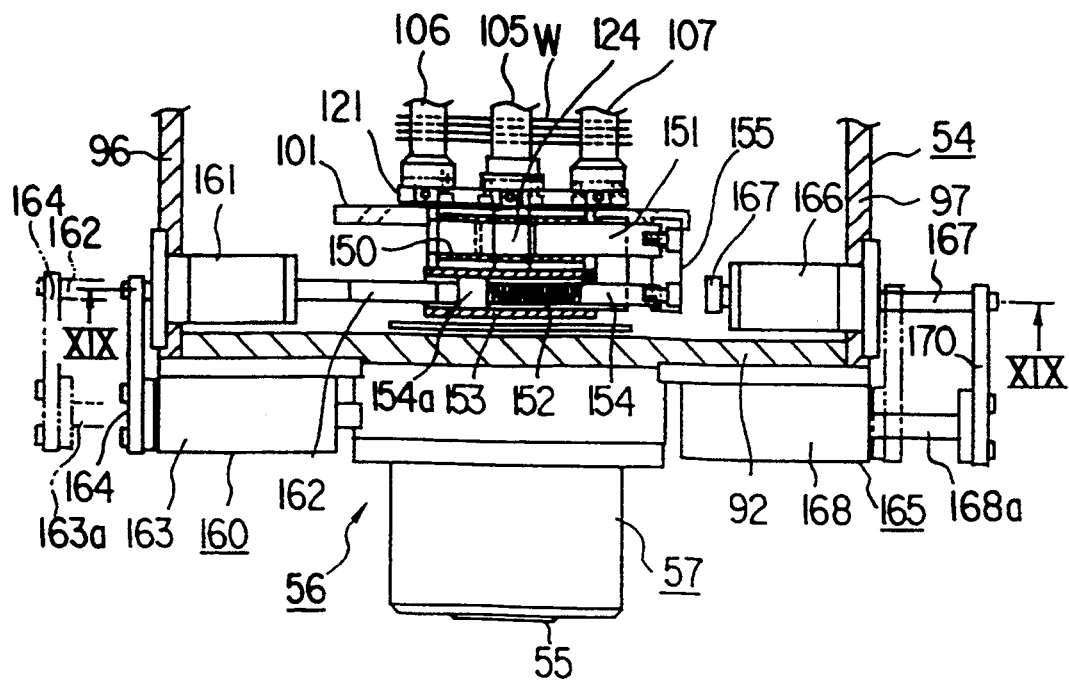
FIG. 18 is a horizontally-sectional view showing a locking section of the upper holder members and the unlocking mechanism.

As shown in FIGS. 3 and 4, the three upper clamp bars 105, 106 and 107 are rotatably supported by the horizontal shaft 126. When they are erected (or released from their wafer clamping function) as shown, they do not interfere with the arms 36 which are carrying the wafers W into and out of the rotor 56. When the upper clamp bars 105, 106, 107 are lowered horizontal, as shown in FIG. 18, a lock pin 151 is inserted into a cylindrical member 150 to lock them to the flywheel 121.

Figure 5:
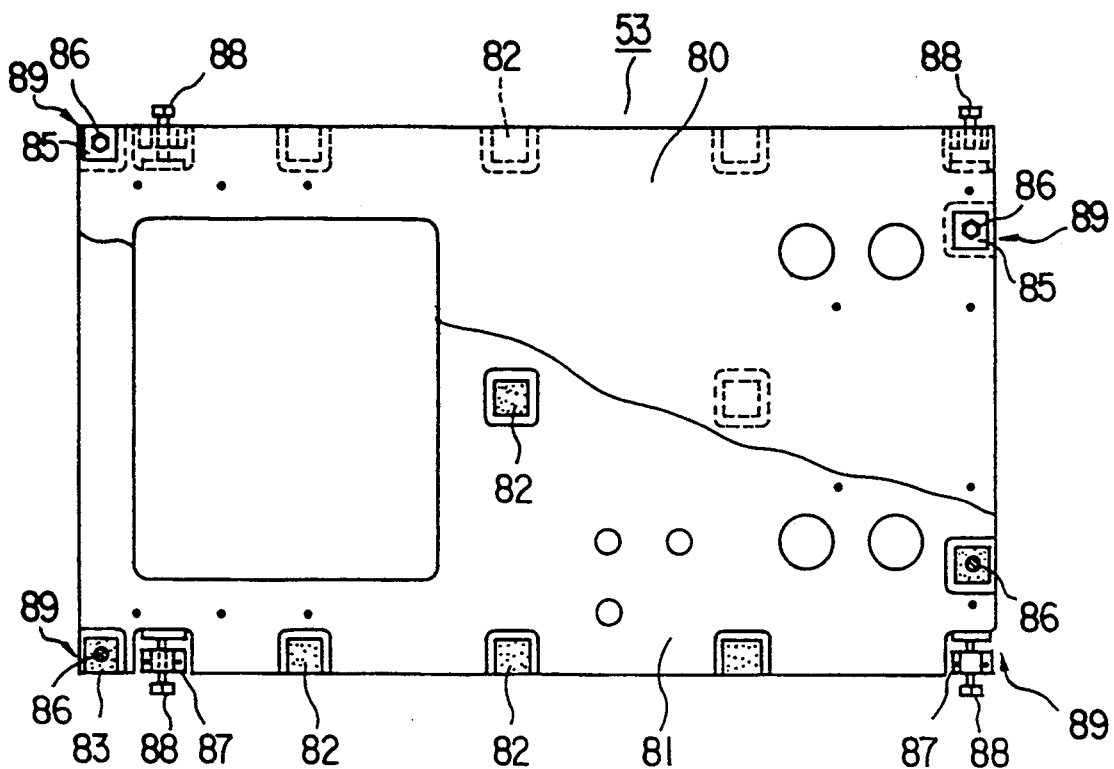
FIG. 5 is a plan showing a base section of the spindrier partly cut away.

As shown in FIGS. 5 and 2, the attaching base mechanism 53 is mounted on the top 52 of the frame 51 of the pedestal 50. It is intended to support the box body 54 and other components and to correctly position the box body 54 relative to the wafers carrying unit 36 whose position is controlled in directions X, Y and Z. It includes two upper and lower base plates 80 and 81 not to transmit vibration, which is caused when the rotor 56 and the motor 58 are rotated, to its peripheral components or units. A plurality of pieces of vibration-proof rubber 82 are interposed between the upper 80 and the lower base plate 81.

Figure 6:
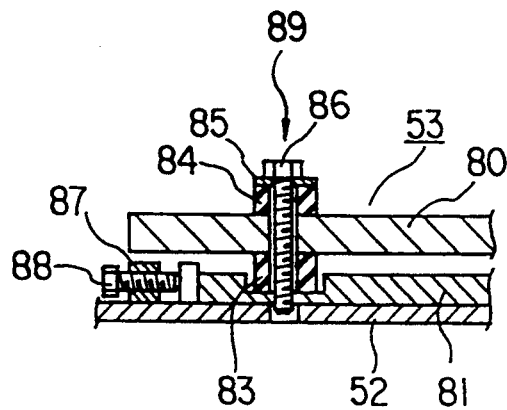
FIG. 6 is a vertically-sectioned view showing a part of the base section.

As shown in FIG. 6, the upper and lower base plates 80 and 81 are connected to each other at their four corners by vibration-proof couplings 89. Each vibration-proof coupling 89 includes rubber bushes 83, washer 85 and a bolt 86. Position adjuster mechanisms 87 and 88 are attached, adjacent to each corner, to the lower base plate 81.

As shown in FIG. 7, both sides 92 of the box body 54 are provided with windows 93 made of transparent acryl, and photo-sensors 94 and 95 are arranged in front of these windows 93. The optical axis of these photo-sensors 94 and 95 is arranged to cross the wafers W in the box body 54. When their beam light is shielded by the wafers W, a signal is applied to the CPU of the computer system and it is thus detected that the wafers W are housed in the box body 54.

The lock mechanism for locking the upper clamp bar bracket 121 to the flywheel 101 will be described referring to FIGS. 16-19 and 7.

Figure 16:
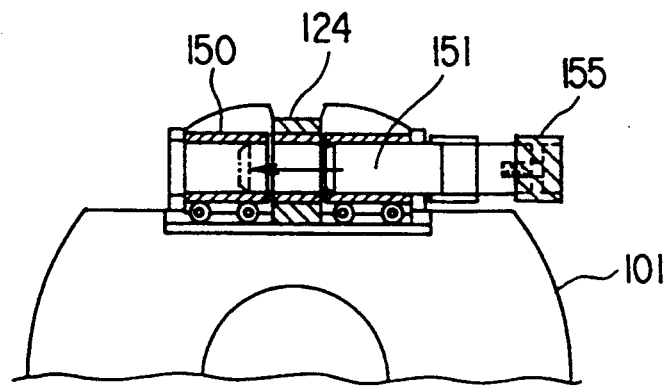
FIG. 16 is a sectional view showing an engaging lock section relative to a rotor on the top of the upper holder members switching mechanism.
Figure 17:
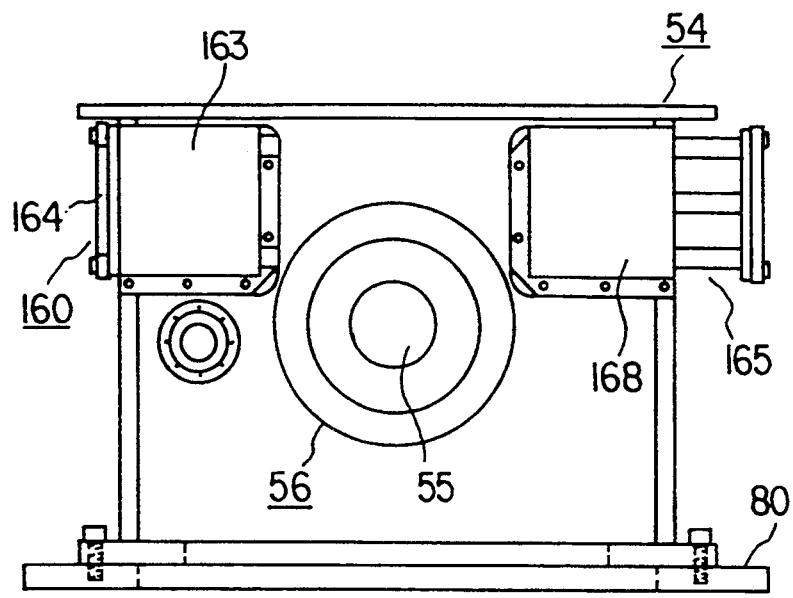
FIG. 17 shows a drive section of the unlock mechanism on the top of the upper holder members switching mechanism viewed from the side of one end face of the box body.

As shown in FIGS. 16 and 18, the projection 124 of the bracket 121 is inserted between two-divided parts of the cylindrical member 150 when the upper clamp bars 105, 106 and 107 are kept locked. The cylindrical member 150 is made of PEEK and fixed to the upper rear side of the flywheel 101. When the upper clamp bars 105, 106 and 107 are to be locked, a lock pin 151 is pushed into the cylindrical member 150 from one end thereof.

Figure 19:
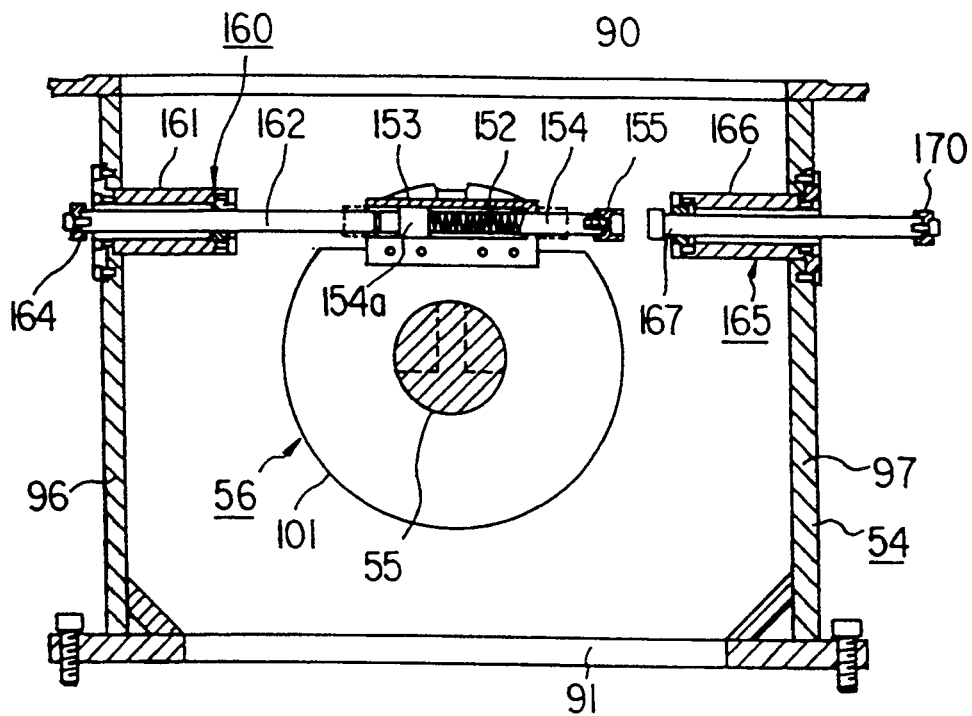
FIG. 19 is a sectional view taken along a line XVIII—XVIII in FIG. 18 and showing the locking section and the unlocking mechanism.

As shown in FIG. 19, a lock spring 152 is used as means for pushing the lock pin 151 deeper into the cylindrical member 150 to lock the upper clamp bar bracket 121 to the flywheel 101. The lock spring 152 is wound round a slide pin 154. The slide pin 154 has a large-diameter stepped portion 154a and it is arranged so as to be slidable in a guide sleeve 153. The guide sleeve 153 is also fixed to the rear side of the flywheel 101 but behind the cylindrical member 150.

The lock pin 151 and the slide pin 154 are connected to each other by a coupling member 155 and they are urged deeper into the guide sleeves 150 and 153 by the lock spring 152.

As shown in FIGS. 18 and 19, the unlocking mechanism 160 is attached to one side 96 of the box body 54. It includes a cylindrical guide member 161, a push rod 162 and an air cylinder 163. The cylindrical guide member 161 is sealingly attached to that portion of the side 96 which is opposed to the front end of the slide pin 154. The push rod 162 is arranged slidable in the cylindrical guide member 161. The air cylinder 163 serves to reciprocate the push rod 162.

As shown in FIG. 18, the air cylinder 163 is located outside the side 92 of the box body 54. A piston rod 163a and the push rod 162 are connected to each other by a coupling arm 164. When the piston rod 163a is advanced forward, the push rod 162 pushes the slide pin 154 against the lock spring 152 so that the lock pin 151 can be pushed out of the hole in the projection 124 of the bracket 121. In other words, the upper clamp bar bracket 121 can be unlocked.

A lock confirming and detecting mechanism 165 is arranged in opposite to the unlock mechanism 160. It includes a cylindrical guide member 166, a detecting rod 167 and an air cylinder 168. The cylindrical guide member 166 is sealingly attached to that portion of the other side 97 of the box body 54 which is opposed to the rear end of the slide pin 154. The detecting rod 167 is arranged slidable in the cylindrical guide member 166 and it serves to detect how deep the lock pin 151 is pushed into the cylindrical member 150. A piston rod 168a and the detecting rod 167 are connected to each other by a coupling member 170. When the piston rod 168a is retracted into the air cylinder 168 by a predetermined stroke, the detecting rod is either contacted or not contacted with the coupling member 155 of the slide pin 154, so that signal representing whether the upper clamp bar bracket 121 is locked or not can be applied to the operation controller (not shown).

As shown in FIGS. 4 and 8, the rotor 56 can be easily detached from the paired shafts 55 when five bolts 173 are pulled out of their holes in a connector 172 of each shaft 55. An attaching shaft 170 is projected from the rear center side of each of the flywheels 100 and 101. A protrusion (or tenon) 171 shaped like the letter T is precision-formed on the front end of the attaching shaft 170. A recess (or mortise) 172 shaped like a horizontally oriented T is precision-formed on the inner end face of the shaft 55. When these protrusions 171 are engaged with the recesses 172, the attaching shafts 170 are coaxially attached to both shafts 55.

When the rotor 56 is to be detached from the shafts 55 for maintenance, the operator may only pull five bolts 173 out of their holes in each attaching shaft 170 while rotating the rotor 56 by his hand. The rotor 56 can be detached, as a unit, from the box body 54 in this manner. Therefore, its cleaning work for it can be made simpler and easier.

As shown in FIGS. 3 and 4, the bearing mechanisms 57 are same in structure and are of the symmetrical relation to the rotor 56. A rectangular and cylindrical fixing bracket 175 is welded to the outer face of the box body side 92 and a bearing unit 176 is attached to the bracket 175. The fixing bracket 175 and the bearing unit 176 form a bearing housing.

The bearing unit 176 includes a casing 177, a thrust ball bearing 178 and a magnetic fluid seal 179. The inner end of the casing 177 is fixed to the fixing bracket 175 by bolts. A seal packing is interposed between the casing 177 and the fixing bracket 175. The thrust ball bearing 178 is arranged in the casing to support the rotating shaft 55 freely rotatable. The magnetic fluid seal 179 is arranged in the casing 177 but nearer to the rotor 56 than the thrust ball bearing 178 is.

The magnetic fluid seal 179 comprises a pair of pole pieces 181 and a permanent magnet 180 sandwiched between the pieces 181. A viscous and gel-like magnetic liquid is held between the outer circumference of the rotating shaft 55 and the seal 179 by a magnetic force created by these components of the seal 179. A groove is formed round each pole piece 181 to allow cooling water to flow in it.

A labyrinth seal 185 is arranged in the casing 177 but nearer to the rotor 56 than the magnetic fluid seal 179 is. It is intended to form a narrow space (or labyrinth) between the inner face of the casing 177 and the outer circumference of the shaft 55. A purge gas introducing passage 186 is formed in the casing 177 to supply clean gas such as nitrogen gas ($N_2$), in which any impurities are hardly contained, into the labyrinth. A purge gas discharging passage 187 is formed in the fixing bracket 175 to exhaust nitrogen gas in the labyrinth through it by a forcedly exhausting mechanism 188. The outer end of the discharging passage is connected to a drain (not shown).

The box body 54 is sealed by the magnetic fluid seals 179 to surely prevent particles caused by the bearings 178 from entering into the box body 54. In addition, the labyrinth seals 185 and the purge gas prevent moisture content in the box body 54 from entering into the magnetic fluid seals 179.

Further, the purge gas can be forcedly exhausted from the labyrinth space by the exhausting mechanism 188. Even when moisture content in the box body 54 enters into the space, therefore, it can be forcedly exhausted together with the purge gas.

Still further, slingers 190 and 191 are provided between the rotor 56 and each bearing mechanism 57. They are attached to the rotating shaft 55 to rotate together with it. The inner one 190 is arranged along the inner face of the side 92 and the outer one 191 along the outer face of it. The slinger 190 is of the double-collar type having two parallel rings. Solution or solution drops separated and scattered can be driven out by the rotating slingers 190 and 191.

As shown in FIG. 3, the rotation drive mechanism 58 has a motor 194 supported above one end of the upper base plate 80 by a support 193. The mechanism 58 is of the direct drive type, having a motor output shaft 193 directly connected to one of the rotating shafts 55 by a coupling 196. When the motor 194 is driven, therefore, the the entire rotor is rotated together with the rotating shaft 55 at high speed.

As shown in FIG. 9, the gravity center GC of the wafer W is shifted downward from the rotation center RC of the rotor 56 by about 4 mm. This is because the wafers W are vibrated and moved in their corresponding holder grooves 112 to wear their edges and cause noises when their center of gravity GC is on the center of rotation RC of the rotor 56.

As shown in FIG. 3, a flywheel 197 is attached to the rotating shaft 55 at an appropriate position thereof to enable the rotor 56 to be smoothly rotated. A rotation stopper hole 198 is formed in the flywheel 197. A stopper pin 201 of a stopper mechanism 200 is moved into and out of the rotation stopper hole 198. When the wafers W are being loaded into and unloaded out of the rotor 56, the flywheel 197 is stopped by the stopper pin 201 to keep the rotor 56 stationary under a predetermined state. A rotary slit plate 202 and a pulse sensor 203 are provided to automatically position the stopper pin 201 relative to the rotation stopper hole 198 of the flywheel 197.

Figure 20:
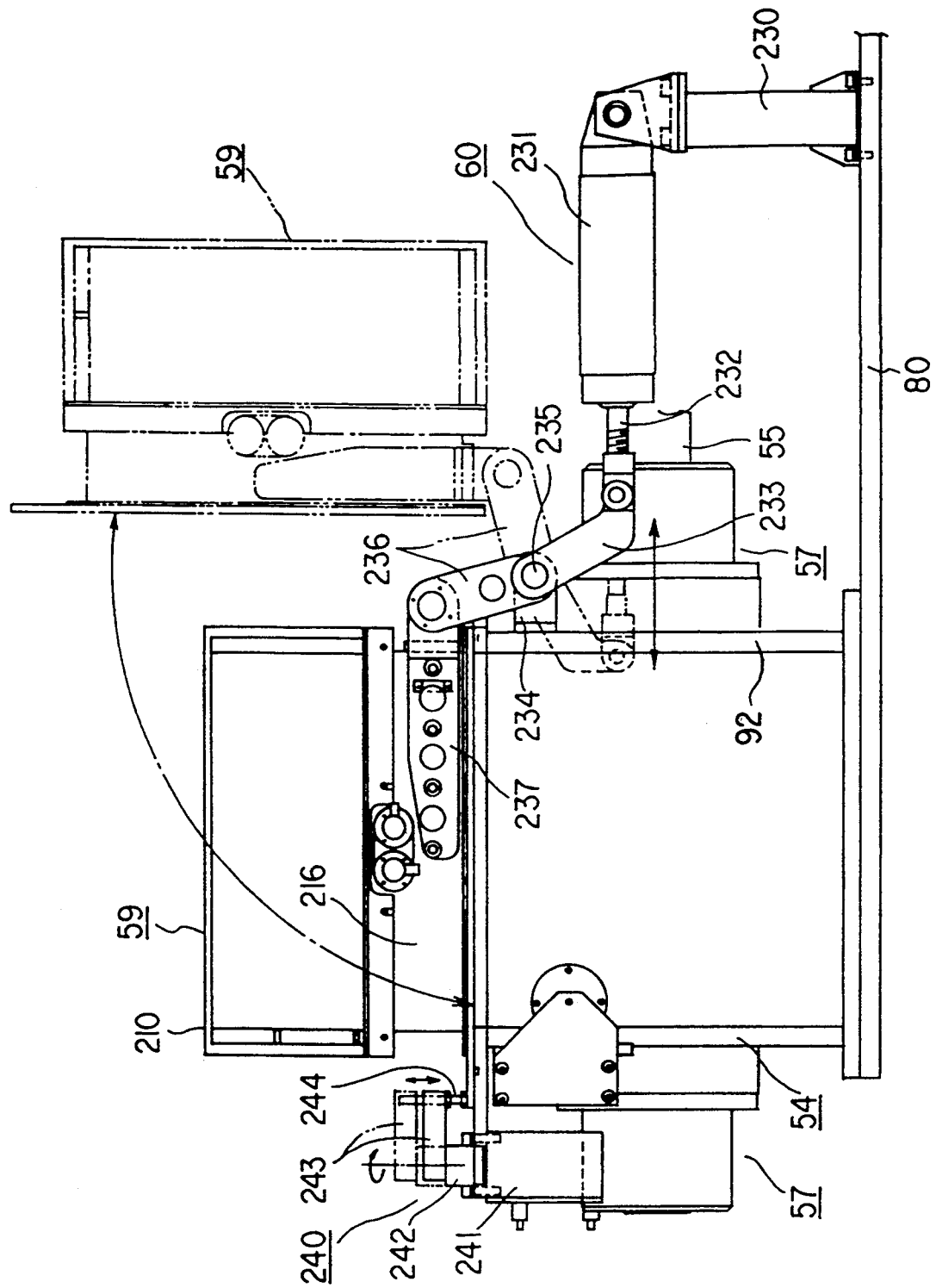
FIG. 20 is a side view showing switching and clamping mechanisms for a gas cleaner.

As shown in FIGS. 20 and 21, an air cylinder 231 of the switching mechanism 60 is supported on the base plate 80 by a stand 230. A swing lever 233 shaped like a letter of L is connected to the front end of a rod 232 in the cylinder 231. A shaft 235 is attached to the outer face of the side wall 92 through a pair of support brackets 234 to swing together with the swing lever 233. A pair of hinge levers 236 are projected from the shaft 235 to swing together with it. A pair of support arms 237 are fixed to their corresponding front ends of the hinge levers 236 to support both sides of an auxiliary frame 216.

When the air cylinder 231 of the switching mechanism 60 is driven, the swing lever 233, the shaft 235 and the hinge levers 236 are rotated to swing the gas cleaner 59 by about 90°.

Operation of the above-described embodiment of the present invention will now be explained.

The cassettes 20 in which wafers to be processed are housed are loaded into the input buffer section 22 and then temporarily stored in the cassettes stocking section 28. These cassettes 20 in the cassettes stocking section 22 are successively transferred into the loader section 32 by the arms 30 as the wafer process progresses.

Those wafers in the cassettes 20 in the loader section 32 which are to be processed are carried by the wafers carrying arms 36 and processed in the chuck cleaning and drying divisions 38, the solution-processing divisions 40, the cleaning divisions 42 and the spinning and drying division 44 in which the spindrier according to the present invention is arranged. The wafers thus processed are again housed in cassettes 20 and carried outside from the output buffer section 26. Ammonid water, hydrogen peroxide water, hydrochloric acid, fluorine and sulfuric acid, for example, are used as chemical solutions.

The gas cleaner 59 is swung open from the top of the box body 54 by the switching mechanism 60 and the rotating shaft 55 is stopped by the stopper mechanism 200. While keeping the rotor 56 stationary at a predetermined angle, the upper clamp bars 105, 106 and 107 of the rotor 56 are unlocked by the unlocking mechanism 160. The upper holder members switching mechanism 130 then advances the transmission shaft 134 and engages it with the shaft 126. The mechanism 130 is rotated under this state to swing the upper clamp bars 105-107 erected.

Fifty two sheets of wafers W which have been cleaned are then lowered into the rotor 56 and seated in the wafer holder grooves 112 on the three lower clamp bars 102-104.

The wafers carrying arm 36 is retreated and the wafers W are clamped by the upper clamp bars 105-107. The upper holder members switching mechanism 130 retracts the transmission shaft 134 and releases it from the shaft 126, while the unlock mechanism 160 is retracted and the lock pin 151 is automatically urged by the lock spring 152 to lock the upper clamp bars 105-107 closed.

When the setting of the wafers W into the rotation holder mechanism 56 is finished in this manner, the switching mechanism 60 is reversely operated to swing the gas cleaner 59 onto the top of the box body 54 and this closed state of the box body 54 is clamp-held by the clamp mechanism 124. The stopper mechanism 200 is retreated to keep the rotating shaft 55 rotatable.

The motor 194 of the rotation drive mechanism 58 is then driven and the entire penultimate line rotor 56 is thus rotated together with the rotating shafts 55, which are located on both sides of the rotor 56, at a predetermined high speed. An exhaust blower 255 is made operative this time and clean dry air is taken in the box body 54. While separating moisture content from the wafers W by centrifugal force, the wafers W are completely dried by the flow of dry air.

The amount of clean air or gas introduced into the box body 54 is set at about 17 m$^3$/min, for example, when the size of the open top 399 of the box body 54 is 580 mm $\times$ 550 mm. The pressure difference outside and inside the box body 54 is set about 50 mmH$_2$. The rate of rotation of the rotation holder mechanism 56 is initially raised from 0 to 500 rpm and the value of rotation of 500 rpm is kept constant for about 60 seconds, for example. Large solution drops are removed from the wafers W by centrifugal force thus created. The rate of rotation of the mechanism 56 is then raised to 1500 rpm, for example, and this rate of rotation of 1500 rpm is kept constant for 2 or 3 minutes. Small solution drops are thus removed from the wafers W while moisture content on each wafer is evaporated and dried by the flow of clean gas or air. The motor 194 is then stopped and the rotation holder mechanism 56 is gradually stopped within about 20 seconds to complete the drying of the wafers w.

The initial rate of rotation of the wafers W is set low or about 500 rpm as described above. In addition, the lowermost perforated plate 414 of solution drops shielding means in the gas cleaner 59 is separated from the center of the wafers W by a distance H, which is greater than the maximum height which solution drops each having a relatively large diameter of 5 mm or more and scattered upward can reach when the wafers W are rotated at the speed of 500 rpm. This can prevent relatively large diameter solution drops from adhering to the perforated plate 414. To add more, the flow velocity of gas or air flowing through a bottom discharging opening 249 of the box body 54 is about 1 m/sec. Even when solution drops which have collided against inner faces of the box body 54 are made fine and splashed back, therefore, they can be efficiently discharged downward by the gas whose flow velocity has become high, and they can be thus prevented from again adhering to the wafers W.

The gas containing a moisture content in the box body 54, and the solution drops flowing down along the inner faces of the box body 54 can be thus guided into a gas and solution separator 251 through the bottom opening 249 of the box body 54. The moisture content contained in the gas is separated from the gas in the separator 251 and collected into a water collecting port 252 of the separator 251 and appropriately discharged outside through a drain opening 253. On the other hand, the gas thus separated is discharged outside from the separator 251 through a discharging duct 254 by the discharging blower 255.

When the rotor 56 is being rotated, cooling water is supplied into the passages 183 to cool the bearing units 176 which are located on both sides of the rotor 56, while clean nitrogen gas is supplied, as a purge gas, into the passages 186.

The box body 54 can be thus air-tightly sealed by the magnetic liquid seals 179 to reliably prevent particles caused by the bearings 178 from entering into the box body 54. In addition, moisture content in the box body 54 can be prevented from entering into the magnetic liquid seals 179 by nitrogen gas supplied into the labyrinth seals 185. This can keep magnetic liquid dry in the seals 179 so as to not reduce the sealing capacity of the seals 179.

Further, the nitrogen gas in the labyrinth seals 185 can be forcedly discharged outside through the purge gas discharging passage 187 by the forcedly discharging mechanism 188. Even when the moisture content in the box body 54 enters into the labyrinth seals 185, therefore, it can be discharged outside together with nitrogen gas.

Still further, moisture content scattered from the box body 54 can be splashed back by the slingers 190 and 191. Moisture content entering particularly into the bearing units 57 can be reliably prevented by double collars of each of the inner slingers 190. The capacity of the magnetic liquid seals 179 can be kept high to achieve a higher sealing effect.

According to the spindrier of the present invention, wet semiconductor wafers w can be cleaned and dried for a shorter time without any particles adhered to them. Particularly, the grooves 112 (or 113) are formed on the clamp bars 102-107 to have such a specific shape that enables the solution to be more easily removed from them. Therefore, no solution remains in them so as to thereby leave the rim portions of the wafers W dry. This enables each entire wafer to be completely dried.

When the drying of the wafers w is finished, the rotation of the rotating shaft 55 is stopped by the stopper mechanism 200 and the rotor 56 is stopped to keep O.F. of the wafers W directed upward. The cap member 400 is swung to open the box body 54 by the switching mechanism 60. The upper clamp bars 105-107 of the rotor 56 are unlocked and then erected by the upper holder members switching mechanism 130. The wafers carrying arm 36 is positioned in front of the drying division 44 to take fifty two sheets of wafers out of the box body 54. The wafers are then carried to a next stage.

When the rotor 56 is to be cleaned and checked for maintenance, it can be more easily detached from the rotating shafts 55 which are located on its both sides only by pulling the bolts 173 out of the attaching members while rotating it in the box body 54 by hand. The rotor 56 thus taken out of the box body 54 can be fully cleaned and checked at a different place.

The spindrier according to a second embodiment of the present invention will be described referring to FIGS. 22 through 30. A description of the same components as those of the above-described first embodiment will be omitted.

Figure 22:
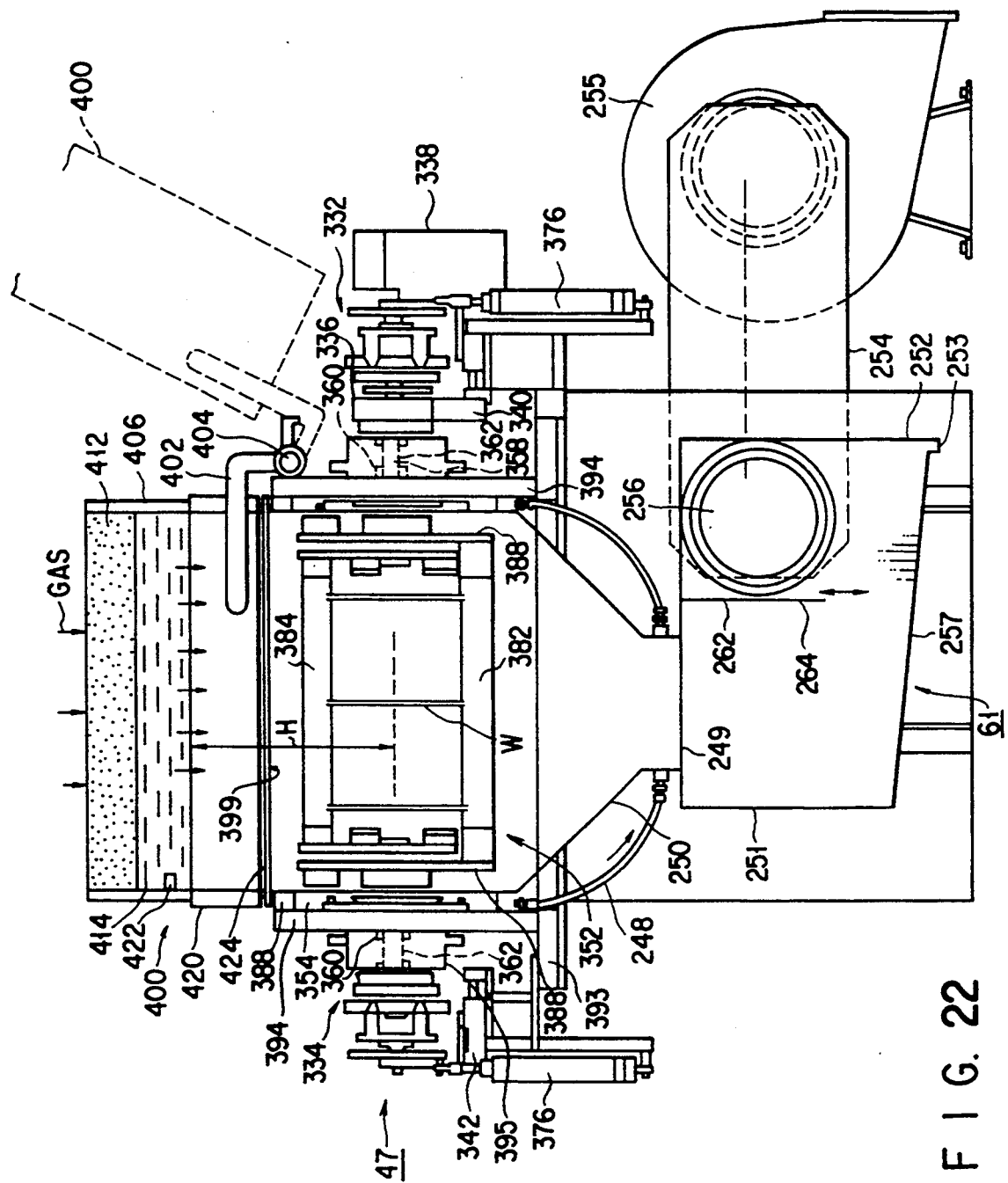
FIG. 22 is a partial sectional view showing the spindrier according to a second embodiment of the present invention viewed from its front side (or in a direction perpendicular to its rotating shaft)
Figure 23:
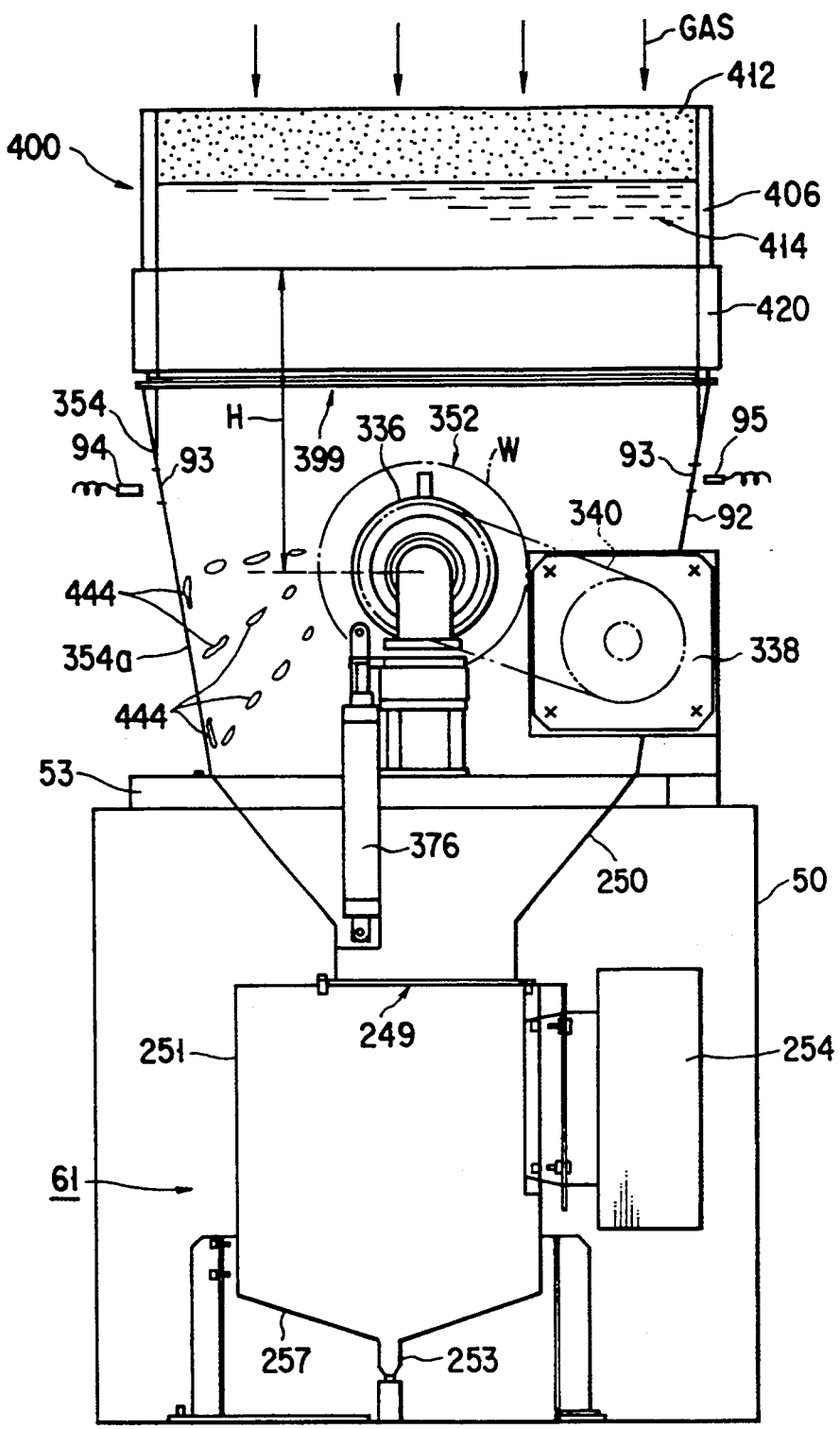
FIG. 23 is a sectional view showing the spindrier viewed from its side (or along its rotating shaft)

As shown in FIGS. 22 and 23, a box body 354 for the spindrier is shaped like a box container, enclosing a rotor 352, and it is made of stainless steel. It has a gas introducing opening 249 at its top and a discharging opening 249 at its bottom. Its upper portion (or first choked portion) is gently choked but its lower portion (or second choked portion) is increasingly choked as it to approaches its bottom. Its top opening 399 has a size of 580 mm×550 mm.

Both sides 92 of the box body 352 is provided with windows 93 made of transparent acryl and photosensors 94 and 95 are arranged in front of these windows 93. The photo-sensors 94 and 95 have an optical axis crossing wafers W in the box body 354.

As shown in FIG. 2, an air supply passage 390 is arranged above the drying division 44 and clean air is supplied, as a downward flow, into the clean gas or air introducing mechanism 400 through an opening 391 of the passage 390.

As shown in FIG. 22, the clean air introducing mechanism 400 is enclosed by an outer frame 406 and an auxiliary frame 420. The outer and auxiliary frames 406 and 420 are shaped like rectangles and made of stainless steel plates. A ULPA filter 412 and a shielding means 414 against solution drops are arranged in the outer frame 406. The downward flow of air passes through the filter 412 of the clean gas introducing mechanism 400 and then through the shielding means 414 thereof. Solution separated from the wafers W by centrifugal force is shielded by the shielding means 414.

The auxiliary frame 420 is attached to the lower portion of the outer frame 406 and it serves as a spacer for adjusting the distance H which extends from the lower end of the shielding means 414 to the center of the wafers W. This distance H is set as 300 mm, which is the maximum which solution drops, each having a diameter of 5 mm and separated from the wafers W by centrifugal force, can reach. An ionizer 422 is detachably attached to the inner face of a side of the outer frame 406. It generates plus and minus ions, when the wafers W are being dried, to neutralize any charge on the wafers W and remove it from them.

The cap 400 is swung round a shaft 404 by 90°. A seal member 424 is provided along the rim of the air introducing opening 399 of the box body 354 to airtightly contact the cap 400 with the box body 354. It is made of silicon rubber.

As shown in FIGS. 22 and 23, the bottom opening 249 of the box body 354 is communicated with a container 251 of the air and solution discharging mechanism 61. The container 251 is shaped to easily collect water in the center of its bottom 257, which is gently titled downward to the water collecting port 252. The water collecting port 252 is provided with the drain 253 through which water trapped is drained.

A partition plate 262 is hung from the ceiling of the container 251 halfway into the container 251. A flow rate adjusting plate 264, movable up and down, is attached to the lower end of the partition plate 262 to adjust the sectioned area of a flow passage 266 which is formed under the plate 264. An opening 256 is provided in a side 270 of a chamber 268 which is formed downstream the partition plate 262 in the container 251. It is communicated with the air intake side of the blower 255 through the duct 254.

Figure 24:
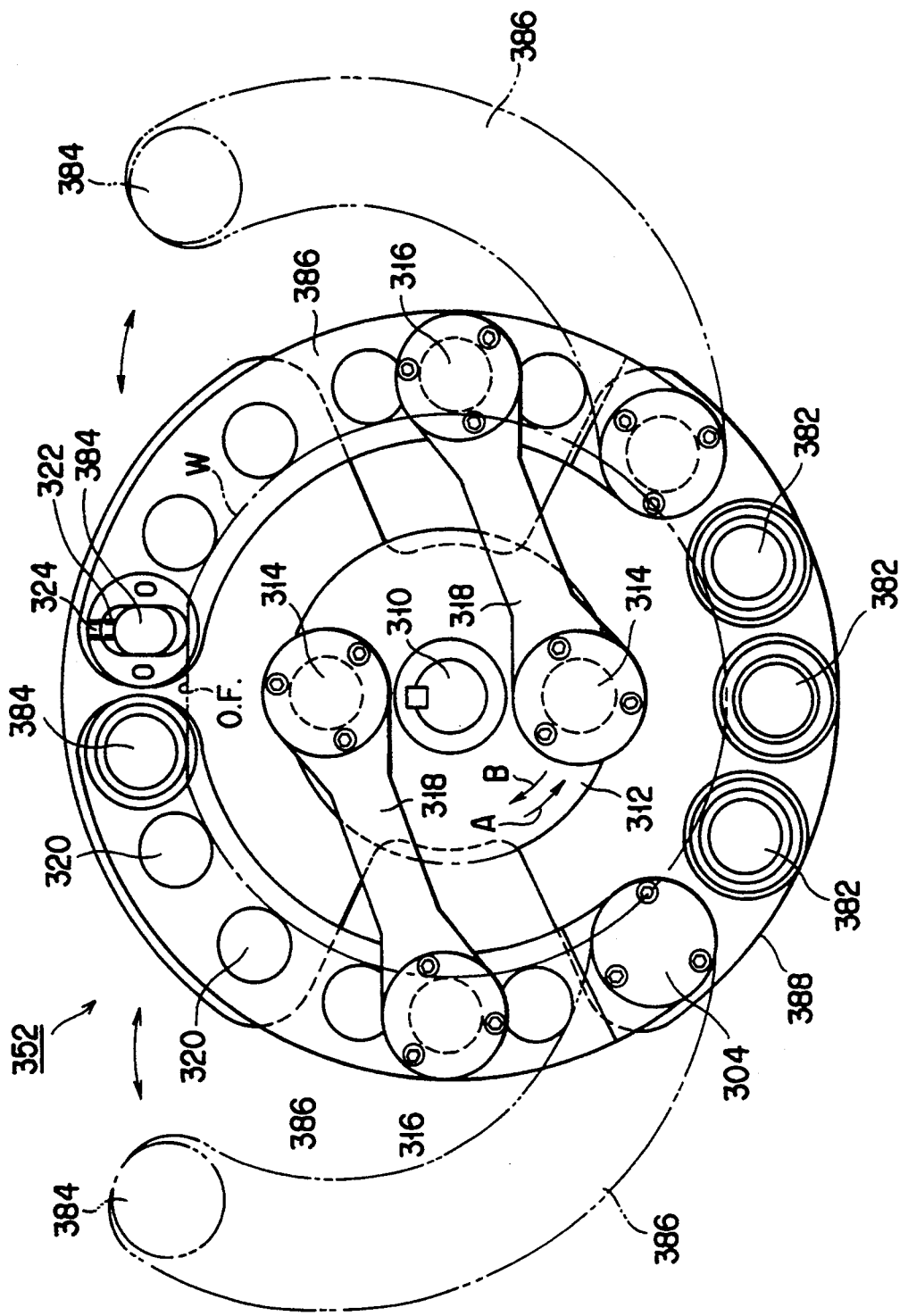
FIG. 24 is a side view showing the rotor of the double-shaft type viewed along its rotating shaft.

As shown in FIG. 24, the rotor 352 has three lower clamp bars 382 and two upper clamp bars 384. The upper and lower clamp bars 384 and 382 are arranged parallel to the rotating shaft of the rotor 352 and they have a plurality of grooves 113 for holding the wafers W therein. The upper ones 384 are contacted with O.Fs. of wafers W and their both ends are connected to switching arms 386. Each of the four switching arms 386 is shaped like an arc. Base ends of these arms are attached swingable to flywheels 388 through PEEK-made bearings 304 and fixing shafts 306. Two coupling members 318 are fixed to disks 312 and the flywheels 388 by bolts 314 and 316 and the disk 312 and its corresponding flywheel 388 are thus connected to each other.

Each of the lower clamp bars 382 is made by press-fitting a stainless-steel round pipe 396 into a fluorinated-ethylene-resin pipe 398. Fifty two annular grooves 113 are formed round the resin pipe 398. These grooves 113 are arranged at a same pitch interval or at irregular pitch intervals. Each of the grooves 113 has a section shaped like a letter of Y, as shown in FIG. 11. Each groove 113 has a width $L_1$ of about 4.3 mm and a width $L_2$ of about 0.85 mm.

Each of the upper clamp bars 384 is made by press-fitting a stainless-steel round pipe 326 into a fluorinated-ethylene-resin pipe 328. Fifty two annular grooves 112 are formed round the resin pipe 328. These grooves 112 are arranged at a same pitch interval or at irregular pitch intervals. Each of the grooves 112 has a section shaped like a letter of V, as shown in FIG. 10. Each groove 112 has a width $L_3$, about 1.45 mm larger than the width $L_1$ of each groove 113. The wafers W each having a thickness of about 0.725 mm are held in their corresponding grooves 112 and 113.

Figure 25:
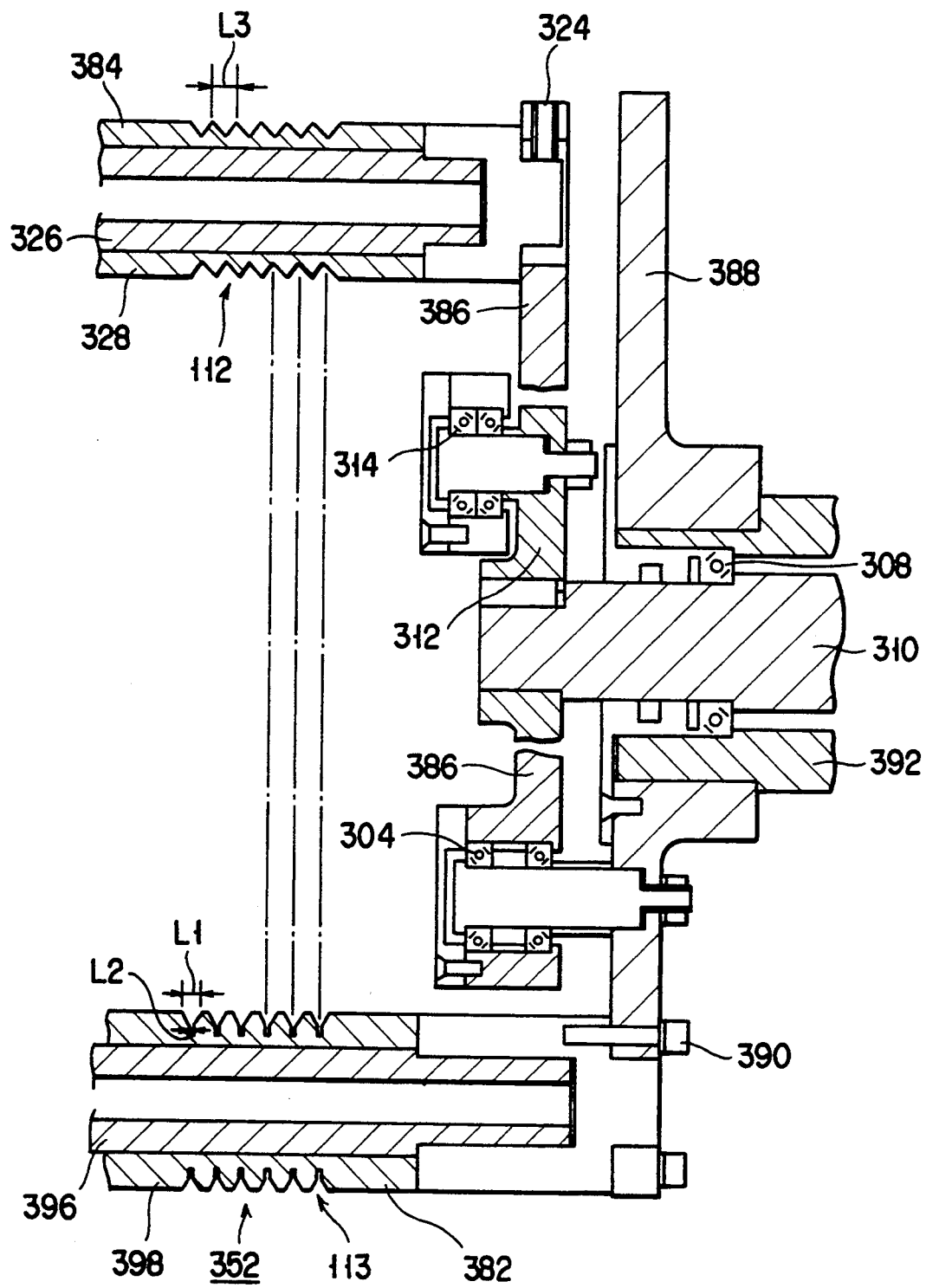
FIG. 25 is a vertically-sectioned view showing a main portion of the double-shaft type rotor.

As shown in FIG. 25, both ends of each of the lower clamp bars 382 are fixed to outer rim portions of the paired flywheels 388 by screws 390. The ends of hollow (or rotating) shafts 392 are connected to the centers of the flywheels 388. These rotating shafts 392 are rotatably attached to attaching plates 394 through bearings 360. Each of the attaching plates 394 is erected from a base plate 393 and fixed to it. Each bearing 360 is arranged in a bearing unit 395.

As shown in FIG. 24, a small-diameter disk 312 is arranged inside the paired switching arms 386. It is fixed to one end of a switching shaft 310 in the hollow shaft 392 through a bearing 308. Two coupling arms 318 are stretched between the switching arms 386 and the disk 312 through PEEK-made bearings 314 and 316. When the disk 312 is rotated by about 90°, the paired switching arms 386 are opened (or closed). Each switching arm 386 is provided with an appropriate number of balance holes 320. One of the upper clamp bars 384 has a slit 322 in that portion thereof which is attached to the arm 386, and the position of a bolt 324 is adjusted along this slit 322.

Figure 26:
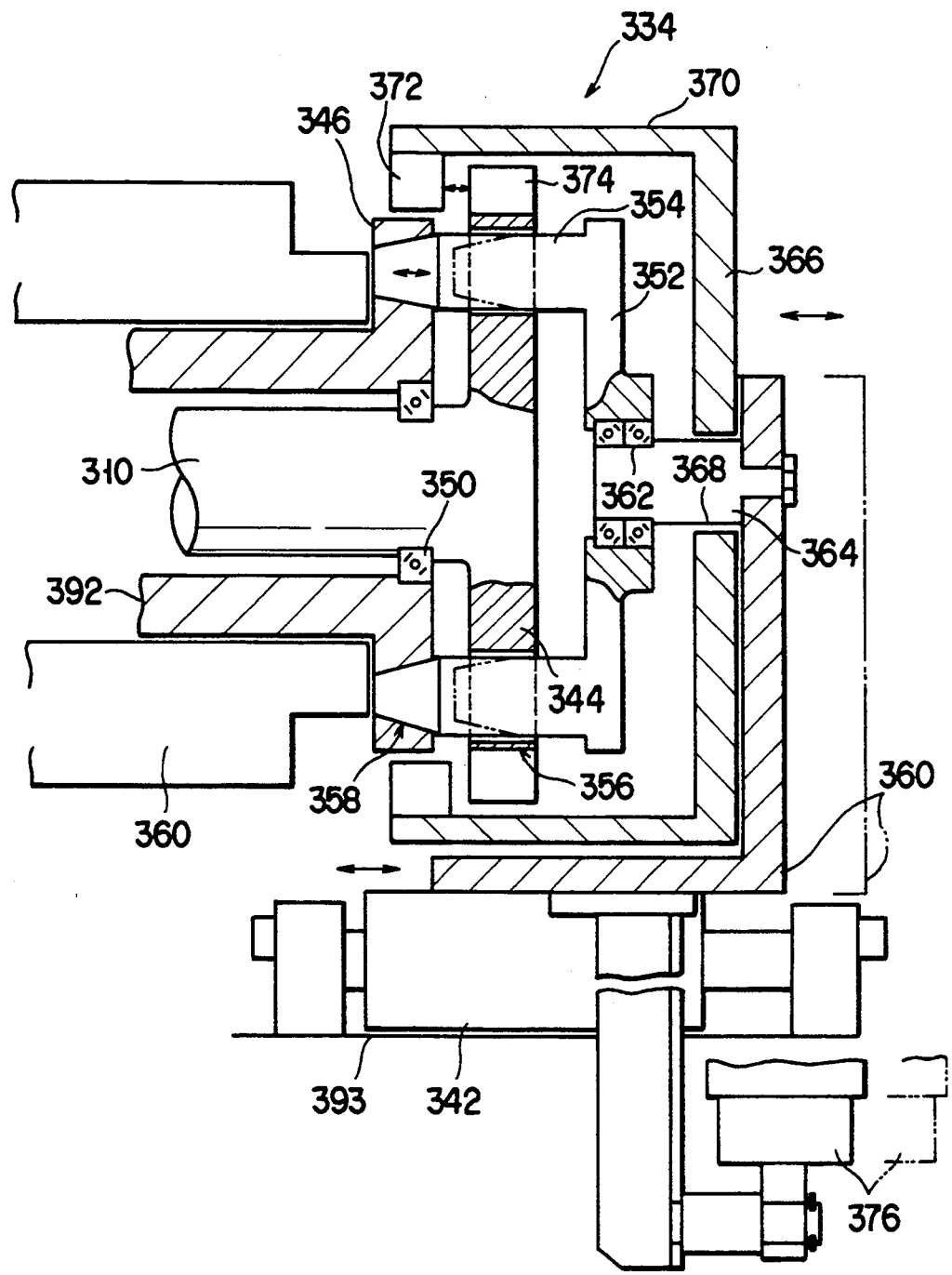
FIG. 26 is a vertically-sectioned view showing a mechanical clutch mechanism of the double-shaft type rotor.
Figure 27:
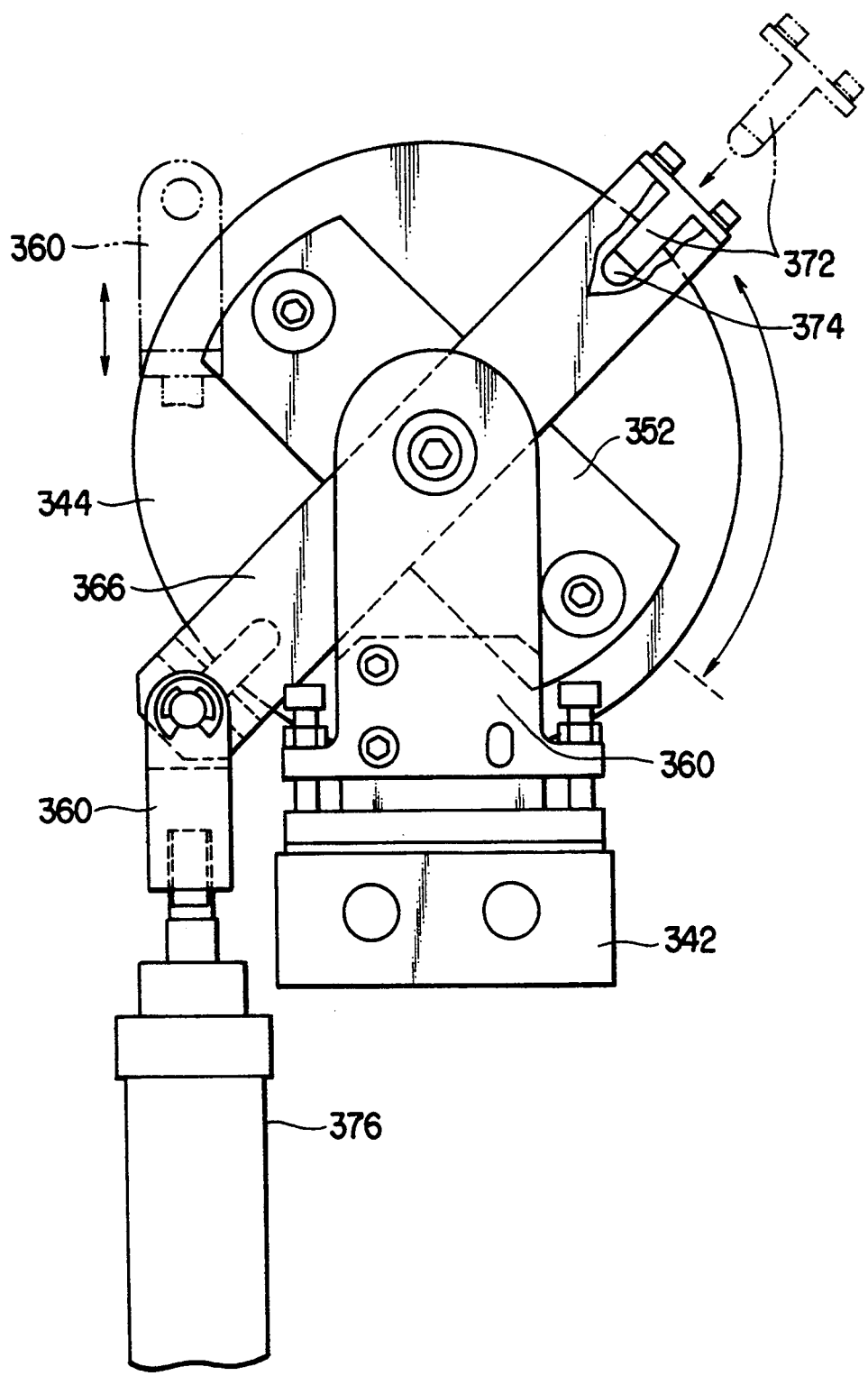
FIG. 27 is a side view showing the mechanical clutch mechanism viewed along its rotating shaft.

As shown in FIGS. 26 and 27, a clutch mechanism 332 or 334 is attached to ends of each rotating shaft 392 and each switching shaft 310 to connect and release them. Both clutch mechanisms are of substantially the same structure, as shown in FIGS. 22 and 23, but a pulley 336 is fixed to the rotating shaft 392 which is located on the side of the clutch mechanism 332, and a belt 340 is stretched between the pulley 336 and the rotating shaft of a motor 338. The rotor 352 can be rotated, if necessary, by this clutch mechanism 332. The other clutch mechanism 334 has no pulley.

The clutch mechanism 334 will be described with reference to FIG. 26.

The rotating shaft 392 itself is rotatably supported by the bearing 360. The clutch mechanism 334 is slidably supported on the base plate 393 and slid in the horizontal direction by a horizontal cylinder 342.

A clutch disk 344 is attached to one end of the switching shaft 310. An engaged plate 346 which is opposed to the clutch disk 344 is attached to one end of the hollow rotating shaft 392. A bearing 350 is interposed between the ends of both shafts 310 and 392.

The clutch disk 344 is provided with two through-holes 356, into which engaging pins 354 are inserted. The engaging pins 354 are shaped conical and projected horizontal from both ends of a clutch arm 352. Further, the engaged plate 346 is provided with two engaged holes 358. These engaged holes 358 are positioned so as to correspond to the through-holes 356 of the clutch disk 344 and front end portions of the engaging pins 354 are engaged with the engaged holes 358. The clutch disk 344 and the engaged plate 346 are engaged with each other and released from each other by these engaging pins 354 and holes 356 and 358.

The clutch arm 352 is rotatably attached to an attaching plate 360 through a bearing 362 and a shaft 364. The attaching plate 360 is attached to the horizontal cylinder 342.

An engaging arm 366 is rotatably attached to the shaft 364 through a bush 368 in such a way that it perpendicularly crosses the clutch arm 352. Auxiliary arms 370 are projected from both ends of the engaging arm 366, extending horizontally over the clutch disk 344. An engaging piece 372 is attached to the front end of each of the auxiliary arms 370, extending toward the axial center of the clutch mechanism. Engaged grooves 374 are formed in the rim portion of the clutch disk 344 and engaged with their corresponding engaging pieces 372 of the auxiliary arms 370.

When the engaging pins 354 are inserted into the holes 356 and 358 and the clutch disk 344 is thus engaged with the engaged plate 346, the engaging pieces 372 are released from the clutch disk 344. When the engaging pins 354 are pulled out of the holes 356 and 358 and the clutch disk 344 is thus released from the engaged plate 346, the engaging pieces 372 are fitted into the engaged grooves 374 of the clutch disk 344 to engage the clutch disk 344 with the engaging arm 366.

As shown in FIG. 27, a cylinder 376 is connected to one end of the engaging arm 366 to swing the arm 366 by 90°. It is fixed to the attaching plate 360. When the engaging arm 366 is swung by 90° under such a state that the engaging pieces 346 are engaged with the engaged grooves 374 (as shown in FIG. 26, the engaging pins 354 are released from the engaged holes 358 in this case), only the switching shaft 310 is rotated by 90° to open and close the upper clamp bars 384.

Figure 28:
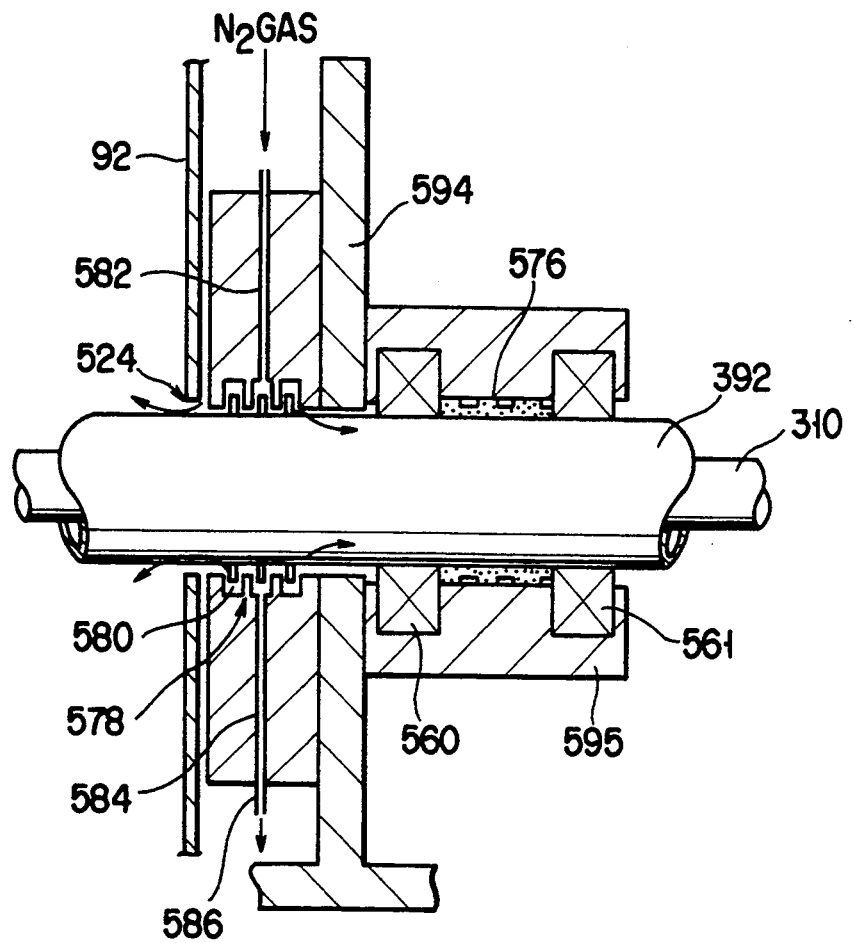
FIG. 28 is a partly-sectioned view showing an shaft seal mechanism of the double-clutch type rotor.
Figure 29:
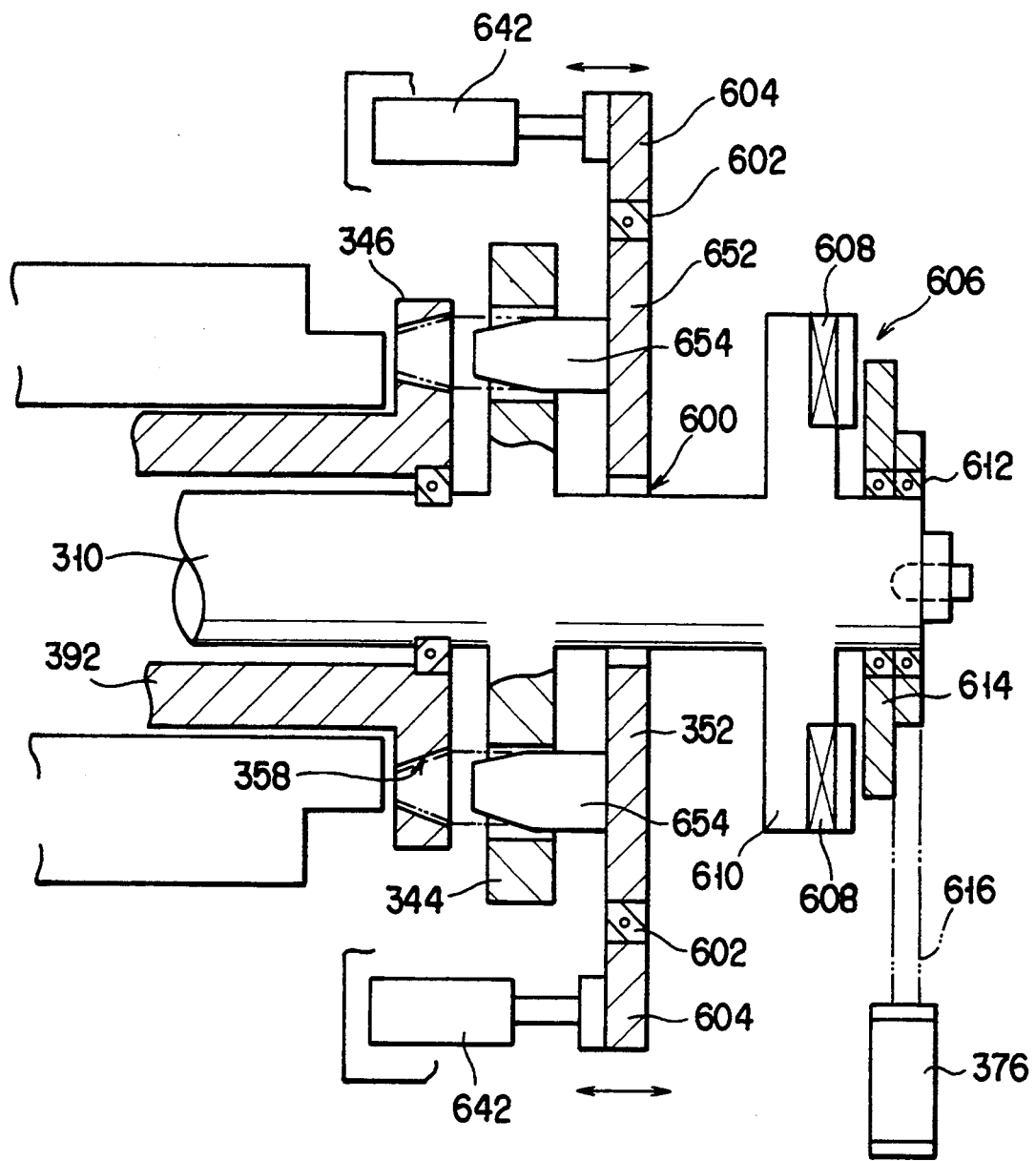
FIG. 29 is a vertically-sectioned view showing an electromagnetic clutch mechanism of the double-shaft type rotor.

As shown in FIG. 28, a magnetic liquid seal member 576 is arranged between a pair of bearings 560 and 595 which support a rotating shaft 392. Further, a labyrinth seal is arranged nearer to the box body than the magnetic liquid seal member 576 is. The labyrinth seal 578 has a zigzag space 580 formed between projections of the rotating shaft 392 and recesses of a member 594. Passages 582 and 586 are communicated with this labyrinth space 580, so that clean nitrogen gas can be introduced from a gas supply source (not shown) into the labyrinth space 580 through the passage 582 and a part of the nitrogen gas can be discharged outside from the labyrinth space 580 through the passage 586. Most of the nitrogen gas flows into the box body 354.

Nitrogen purge gas flowing toward the bearing 560 prevents particles from entering into the box body 354. On the other hand, nitrogen purge gas flowing toward the box body 354 prevents moisture content from entering into the magnetic liquid seal member 576. Particularly to prevent moisture content from entering into the side of the bearing 560, it is desirable that clearance 524 between the side 92 and the shaft 392 is made as small as possible.

Operations of the mechanisms for locking and unlocking the rotor 352 will now be described.

The engaging pins 354 are pulled out of the holes 358 and 356 to release the clutch disk 352 from the members 346 and 344. At the same time, the engaging pieces 346 are fitted into the engaged grooves 374 to engage the clutch disk 344 with the engaging arm 366.

When the clutch disk 344 is swung by 90° under this state, only the switching shaft 310 (the rotating shaft 392 is kept stationary in this case) is rotated to swing the disk 312 of the rotor 352 by 90°. When the disk 312 is swung like this, the paired upper clamp bars 384 are opened right and left.

After the wafers W are loaded in the rotor 352, the upper clamp bars 384 are closed and the wafers W are firmly held by the upper and lower clamp bars 384 and 382. O.Fs. of the wafers W are positioned along the grooves 112 of the upper clamp bars.

The engaging arm 366 and the clutch arm 352 are slid by the cylinder 342 to insert the engaging pins into the engaged holes 358 so as to engage the clutch disk 344 with the engaged plate 346. The engaging pieces 372 are released from the engaged grooves 374 to release the clutch disk 344 from the engaging arm 366. The clutch arm 352 is thus made rotatable round the shaft 364 through the bearing 362.

The motor 338 is then driven to transmit its rotating force to the shafts 392 and 310 through the pulley 336. The wafers W are thus rotated together with the rotor 352.

It will be described how the wafers W are dried, as shown in FIG. 23.

Clean air is taken into the box body 354 through the open top 399 thereof, while rotating the wafers W together with the rotor 352 and discharging the box body 354 by the blower 255. On the other hand, solution drops (or particle- and mist-like drops) separated from the wafers W by centrifugal force are blocked by the assembly 414 of porous plates to thereby prevent these drops from scattering upward in the box body 354.

The sectioned area of the filter cover 400 is made same as that of the open top 399 of the box body 354. This prevents air from staying at upper corners of the box body 354. In addition, the sectioned area of the box body 354 becomes gradually smaller from the top down. This makes the flow velocity of air higher and higher as it comes nearer to the bottom of the box body. The flow velocity of air in the bottom opening 249 reaches about 1 m/sec, for example. As shown in FIG. 23, therefore, those solution particles which are caused when solution drops 444 collide against side walls 354a of the box body 354 (or fine solution particles splashed back) are not returned back to the wafers W but forced toward the bottom opening 249 by the high flow velocity of air.

Those solution drops 444 which adhere to the tilted side walls 354a are also forced downward along the walls 354a by the high flow velocity of air. When the sectioned area of the box body 354 is made smaller along the flow of air as described above, the flow velocity of air becomes so higher as to more quickly discharge fine solution particles scattered from the wafers W, splashed back by the side walls 354a and present in the box body 354 outside.

The flow rate of clean air is about 17 m³/min when the size of the open top 399 of the box body 354 is set so as to be 580 mm×550 mm. The pressure difference inside and outside the box body 354 is set about 50 mmH₂. The rate of rotation of the rotor 352 is raised from 0 to 500 rpm and this rate of rotation of 500 rpm is kept constant for about 60 seconds during the initial drying process. Large solution drops are thus shaken off from the wafers W. The rate of rotation of the rotor 352 is then raised to 1500 rpm and this rate of rotation of 1500 rpm is kept for 2 or 3 minutes during the intermediate drying process. Small solution drops are thus shaken off from the wafers W. The motor 338 is stopped and the rate of rotation of the rotor 352 is gradually stopped within about 20 seconds during the final drying process so as to complete the drying of the wafers W. As the result, solution can be completely removed from the surfaces of fifty two wafers W. The wafers W are thus made completely dry.

The perforated plate assembly 414 is fully separated from the wafers W (or separated from the wafers W by the distance H) as described above. At the initial drying process during which the rotor 352 is rotated at low speed, therefore, large solution drops each having a diameter of about 5 mm and separated from the wafers W by centrifugal force can hardly reach the lowermost perforated plate 416d. This can prevent the perforated plates 416a–416d and the filter 412 from becoming wet.

According to the above-described second embodiment, the bearings 304, 308 and 314 are made of ceramics. The amount of particles caused by these bearings can be reduced to a greater extent and none of the bearings can be rusted.

When the ionizer 422 attached to the cap 400 is made operative at the process of drying the wafers W, the charging of the wafers w can be prevented to more reliably prevent particles from adhering to surfaces of the wafers W.

The mechanical clutch mechanism 334 shown in FIG. 26 becomes relatively large in size because it includes the auxiliary and engaging arms 307 and 366. An electromagnetic clutch 606 shown in FIG. 29 may be used instead.

In the case of this electromagnetic clutch 606, the switching shaft 310 is further extended toward the box body 354 and loosely passed through a center hole 600 of the clutch arm 352. An auxiliary ring 604 made of stainless steel is rotatably attached to the outer end rims of the clutch arm 352 through ring bearings 602. It is therefore made freely rotatable in relation to the clutch arm 352.

Front arm ends of horizontal cylinders 642 are attached to one side of the auxiliary ring 604. The auxiliary ring 604 and the clutch arm 352 can be moved in the axial direction by the paired cylinders 642. Engaging pins 654 can be thus engaged with and released from both of clutch and engaging plates 344 and 346 by the horizontal cylinders 642.

On the other hand, the electromagnetic clutch 606 is attached to one end of the switching shaft 310 to connect and release the drive cylinder 376 to and from the rotating shaft 392. It includes electromagnets 608, an electromagnetic plate 610 and an attracted plate 614. The electromagnetic plate 610 is fixed integral to the switching shaft 310. The attracted plate 614 is arranged to face the electromagnetic plate 610 and it is rotatably supported by the switching shaft 310 through a bearing 612. When the electromagnets 608 are turned on and off, the electromagnetic plate 610 is connected to and released from the attracted plate 614.

As shown in FIG. 27, the engaging arm 366 is extended from the attracted plate 614 and connected to the rod 360 of the drive cylinder 376.

When arranged as described above, the clutch arm 652 is moved by the horizontal cylinders 642 to pull the engaging pins 654 out of the engaged holes 358 of the engaged plate 346. The engaging plate 646 is thus released from the clutch plate 344. The rotating shaft 392 is kept rotatable relative to the switching shaft 310 under this state.

Power is then applied to the electromagnets 608 of the electromagnetic clutch 606, which is attached to one end of the switching shaft 310, to drive the magnets 608. The electromagnetic plate 610 and the attracted plate 614 are connected to each other by electromagnetic force thus created. When the arm 616 of the drive cylinder 376 is extended or retreated under this state, the drive force of the cylinder 376 is transmitted to the switching shaft 310 through the electromagnetic clutch 606.

When the wafers W are to be rotated at high speed while being held in the rotor 352, the cylinder 376 is made operative to hold the wafers w in the rotor 352. Power supply to the electromagnets 608 of the electromagnetic clutch 606 is then stopped to release the electromagnetic plate 610 from the attracted plate 614. Further, the rods 643 are retreated into the cylinders 642 to move the clutch arm 352 so as to insert the engaging pins 654 into the engaged holes 358. The engaged plate 346 and the clutch plate 344 are thus engaged with each other.

When the rotating shaft 392 is rotated under this state, the switching shaft 310 is rotated together with the rotating shaft 392 under such a state that the former is locked to the latter. The clutch arm 652 is also similarly rotated, but this rotation of the clutch arm 652 is negligible due to the action of the bearings 602 interposed between the clutch arm 652 and the auxiliary ring 604.

The electromagnetic plate 610 of the electromagnetic clutch 606 is also similarly rotated, but the rotation of the switching shaft 610 is negligible due to the action of the bearing 612 interposed between the shaft 610 and the attracted plate 614.

When the above-described electromagnetic clutch 606 is used, its structure can be made simpler and its parts used can be reduced fewer as compared with the mechanical clutch 334. Although two horizontal clutch cylinders 642 have been used in the above case, the present invention is not limited to this number of two.

Figure 30:
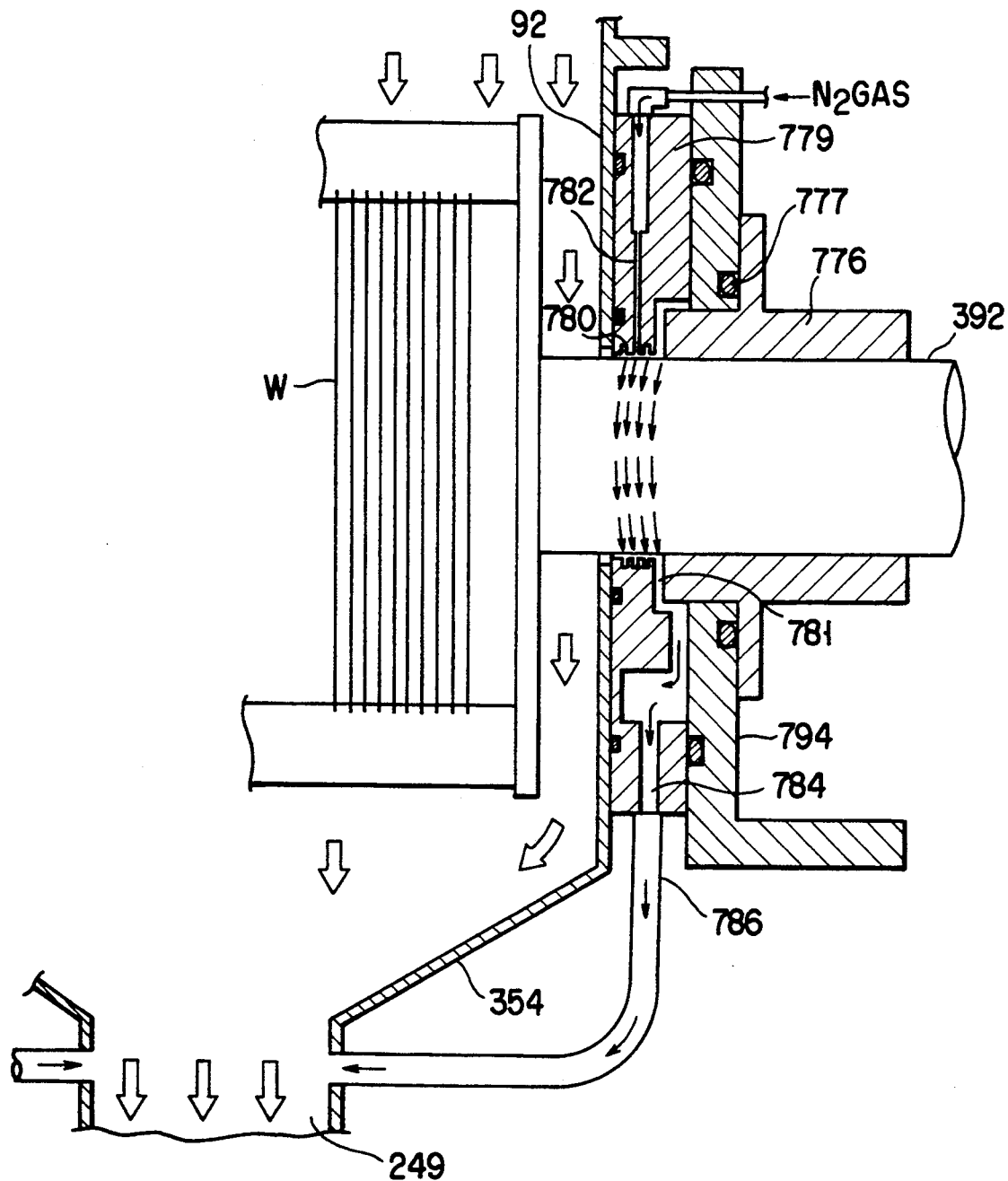
FIG. 30 is a partly-sectioned view showing a variation of the shaft seal mechanism.

In a case where dry nitrogen gas is introduced into a labyrinth seal 780 through a passage 782 and discharged outside through a passage 781 as shown in FIG. 30, the discharging passage 781 may be communicated with the bottom passage 249 of the box body 354 through a pipe 786. The gas passages 781 and 782 are formed in a member 779. An O-ring 777 is interposed between the side 92 and the member 779, between members 779 and 794 and between members 794 and 776.

Although the spindrier has been used to dry semiconductor wafers in the above-described cases, it may be used to dry LCD substrates and printed plates. In addition, it may be applied to other spin-process systems such as the resist and developer coating ones.

In addition to the above-cited cleaning system (in which the cleaning vessels are arranged on a line), the present invention can be conveniently conducted using apparatus as such as disclosed in U.S. Ser. No. 07/791,137, filed Nov. 11, 1991 to Yuji KAMIKAWA and U.S. Ser. No. 07/862,357, filed Apr. 2, 1992 to Kinya UENO, the teachings of which are hereby incorporated by reference.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A spindrier for removing solution or drops of solution from a plurality of substrates by centrifugal force, comprising:
   a box body enclosing the plurality of substrates
   a pair of rotating shaft members opposed to each other and extending into the box body through both sides thereof;
   a mechanism for rotating at least one of said rotating shaft members;
   a rotor mechanism supported by the pair of rotating shaft members;
   wherein said rotor mechanism has a plurality of first clamp members, one end of which is pivotally attached to said rotor, and another end of which is detachably attached to said rotor, and second clamp members, both ends of which are fixed to said rotor for clamping and holding the substrates face to face with their faces directed perpendicular to the rotating shaft members, said second clamp members are connected and fixed to the rotating shaft members to hold lower portions of the substrates thereon when the substrates are set in the rotor mechanism, and said first clamp members have base ends connected to one of said rotating shaft members so that said first clamp members can be swung erected and horizontal relative to one of the rotating shaft members, and wherein front ends are locked to the other of the rotating shaft members when said first clamp members are swung horizontal.
   a mechanism for swinging said first clamp members,
   a lock mechanism for locking said front ends to the one of rotating shaft members, and
   an unlocking mechanism for unlocking said front ends from the other of the rotating shaft members.

2. The spindrier according to claim 1, wherein said rotor mechanism is detachably connected to the pair of rotating shaft members.

3. The spindrier according to claim 1, wherein each of said first and second clamp members is coated with polyfluoroethylene system resin and has a plurality of grooves to hold the substrates therein.

4. The spindrier according to claim 3, wherein each of the grooves has a section shaped like a letter V and one side of each groove has an angle of 15–45 degrees relative to a line vertically extending through the center of the groove.

5. The spindrier according to claim 3, wherein each of the grooves has a section shaped like a letter Y and the lower tilted side of each groove has an angle of 4–12 degrees relative to the line while the upper tilted side thereof has an angle of 20–45 degrees relative to the line.

6. The spindrier according to claim 1, wherein said substrates are held by the first and second clamp members in such a way that their center of gravity is shifted from shafts of said rotating shaft members.

7. A spindrier for removing solution or drops of solution from a plurality of substrates by centrifugal force, comprising:
   a box body enclosing the plurality of substrates;
   a pair of rotating shaft members opposed to each other and extending into the box body through both sides thereof;
   a mechanism for rotating at least one of the rotating shaft members;
   a rotor mechanism supported by the pair of rotating shaft members;
   wherein said rotor mechanism has a plurality of first members and second clamp members for clamping and holding the substrates face to face with their faces directed perpendicular to the rotating shaft members, and said second clamp members are connected and fixed to the rotating shaft members to hold lower portions of said substrates thereon when the substrates are set in the rotor mechanism,
   a switching arm for pushing and releasing them to and from the substrates,
   a hollow shaft connected to the rotating shaft member to make it rotatable, and a center shaft passed through the hollow rotating shaft and connected to the switching arm to swing it.

8. The spindrier according to claim 7, further comprising a clutch mechanism arranged at one end of each of said hollow and center shafts to connect and release them to and from each other.

9. The spindrier according to claim 8, wherein said clutch mechanism includes an engaged plate attached to the hollow shaft, a clutch disk attached to the center shaft, engaging pins movable in the axial direction to engage and release the engaged plate with and from the clutch disk, and mechanism for moving the engaging pins in the axial direction.

10. The spindrier according to claim 7, which comprises an electromagnetic clutch wherein said center shaft is connected to a drive source through said electromagnetic clutch.

11. A spindrier for removing solution or drops of solution from a plurality of substrates by centrifugal force, comprising:
   a box body enclosing the plurality of substrates;
   a pair of rotating shaft members opposed to each other and extending into the box body through both sides thereof;
   a rotor mechanism supported by the pair of rotating shaft members;
   a mechanism for rotating at least one of the rotating shaft members;
   bearing housings attached to both sides of said box body;

a bearing arranged in each bearing housing to support said one of the rotating shaft members so as to be freely rotatable;

a magnetic fluid seal member arranged in each bearing housing to seal a clearance formed round said one of the rotating shaft members;

a labyrinth seal located nearer to the box body then the magnetic fluid seal member;

a supply source for one of supplying clean air and gas into a narrow space formed by the labyrinth seal; and a plurality of slingers located nearer to the box body than the labyrinth seal and rotated together with said one of the rotating shaft members.

12. The spindrier according to claim 11, wherein said slingers are arranged inside and outside the box body along the rim portion of a hole formed in each of both sides of said box body and through which said one of the rotating shaft members is passed.

13. The spindrier according to claim 11, wherein said slinger arranged inside the box body comprises two parallel ring plates.

14. The spindrier according to claim 11, wherein said magnetic fluid seal member is located nearer the box body than the bearing.

15. The spindrier according to claim 11, wherein said bearing comprises a pair of bearings are arranged in the bearing housing.

16. The spindrier according to claim 11, wherein said magnetic fluid seal member is arranged between the paired bearings.

* * * * *